US011063402B2

(12) United States Patent
Wong et al.

(10) Patent No.: US 11,063,402 B2
(45) Date of Patent: Jul. 13, 2021

(54) ADIABATIC DISPERSION-MANAGED FREQUENCY COMB GENERATION

(71) Applicant: The Regents of the University of California, Oakland, CA (US)

(72) Inventors: Chee Wei Wong, Los Angeles, CA (US); Shu-Wei Huang, Los Angeles, CA (US); Yongnan Li, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 16/340,677

(22) PCT Filed: Oct. 31, 2017

(86) PCT No.: PCT/US2017/059390
§ 371 (c)(1),
(2) Date: Apr. 9, 2019

(87) PCT Pub. No.: WO2018/081824
PCT Pub. Date: May 3, 2018

(65) Prior Publication Data
US 2019/0296512 A1 Sep. 26, 2019

Related U.S. Application Data

(60) Provisional application No. 62/415,291, filed on Oct. 31, 2016.

(51) Int. Cl.
*G02B 6/25* (2006.01)
*G02B 6/00* (2006.01)
(Continued)

(52) U.S. Cl.
CPC .......... *H01S 3/0092* (2013.01); *G02F 1/3536* (2013.01); *G02F 1/365* (2013.01);
(Continued)

(58) Field of Classification Search
CPC .......... G02B 6/25; G02B 6/2555; G02B 6/00; G02F 1/3536; G02F 1/365; H01S 3/0085; H01S 3/2391
(Continued)

(56) References Cited

U.S. PATENT DOCUMENTS 7,054,009 B2 * 5/2006 DePue ...................... G01J 3/42
356/437
7,496,117 B2 2/2009 Tang et al.
(Continued)

FOREIGN PATENT DOCUMENTS

CN 110168444 A 8/2019
EP 3500892 A1 6/2019
(Continued)

OTHER PUBLICATIONS

Huang et al., "Smooth and flat-phase-locked Kerr frequency comb generation by higher order mode suppression", Scientific Reports, May 16, 2016, vol. 6, pp. 1-7.
(Continued)

*Primary Examiner* — Kaveh C Kianni
(74) *Attorney, Agent, or Firm* — KPPB LLP

(57) ABSTRACT

Methods and apparatus for providing dispersion-managed dissipative Kerr solitons on-chip are provided. Microresonators are also provided for producing such solitons. The solitons may be enabled by real-time dynamical measurements on frequency combs. Methods are further provided to determine the temporal structure of the intracavity field in both the fast time axis, with ultrafast time-lens magnifiers at 600 fs timing resolutions, and the slow time axis via optical sampling with a synchronized fiber frequency comb reference. An order-of-magnitude enlarged stability zone of the dispersion-managed dissipative Kerr solitons is achieved versus the static regimes.

9 Claims, 28 Drawing Sheets

(51) Int. Cl.
G02F 1/35 (2006.01)
G02F 1/365 (2006.01)
H01S 3/00 (2006.01)
H01S 3/23 (2006.01)
H01S 3/16 (2006.01)
H01S 5/00 (2006.01)
H01S 5/14 (2006.01)
H01S 3/067 (2006.01)

(52) U.S. Cl.
CPC .......... *H01S 3/0085* (2013.01); *H01S 3/1608* (2013.01); *H01S 3/2391* (2013.01); *H01S 5/0092* (2013.01); *G02F 2203/17* (2013.01); *G02F 2203/56* (2013.01); *H01S 3/06758* (2013.01); *H01S 3/2375* (2013.01); *H01S 5/14* (2013.01); *H01S 2301/085* (2013.01)

(58) Field of Classification Search
USPC .......................................................... 385/1
See application file for complete search history.

(56) References Cited

U.S. PATENT DOCUMENTS

| | | | |
|---|---|---|---|
| 7,502,532 | B2 | 3/2009 | McCallion et al. |
| 7,684,664 | B2* | 3/2010 | Digonnet ............... B82Y 20/00 385/16 |
| 7,965,914 | B2 | 6/2011 | Xu et al. |
| 9,880,446 | B2* | 1/2018 | Gottschall ................. G02F 1/39 |
| 2011/0019957 | A1 | 1/2011 | Alameh |
| 2011/0255554 | A1 | 10/2011 | Delfyett |
| 2012/0039344 | A1 | 2/2012 | Kian et al. |
| 2013/0003766 | A1 | 1/2013 | Savchenkov et al. |
| 2014/0064734 | A1 | 3/2014 | Witzens |
| 2014/0110572 | A1 | 4/2014 | Li et al. |
| 2015/0030040 | A1 | 1/2015 | Zhou et al. |
| 2015/0338202 | A1 | 11/2015 | Xiang et al. |
| 2016/0011489 | A1* | 1/2016 | Herr ....................... G02F 1/3551 385/2 |
| 2016/0147014 | A1 | 5/2016 | Ptasinski et al. |
| 2016/0327743 | A1* | 11/2016 | Kippenberg .......... H01L 21/042 |
| 2017/0329086 | A1* | 11/2017 | Latawiec ........... G02B 6/29335 |
| 2018/0006424 | A1* | 1/2018 | Vahala ................ H01S 3/08086 |
| 2018/0083599 | A1* | 3/2018 | Kippenberg ......... H03H 3/0072 |

FOREIGN PATENT DOCUMENTS

| | | | |
|---|---|---|---|
| EP | 3532895 | A1 | 9/2019 |
| EP | 3676646 | A1 | 7/2020 |
| WO | 2018081824 | A1 | 5/2018 |
| WO | 2018089075 | A1 | 5/2018 |
| WO | 2019046645 | A1 | 3/2019 |
| WO | WO-2019180655 | A1* | 9/2019 ......... G02B 6/29341 |
| WO | 2020097241 | A1 | 5/2020 |

OTHER PUBLICATIONS

Ilday et al., "Self-Similar Evolution of Parabolic Pulses in a Laser", Physical Review Letters, May 27, 2004, vol. 92, No. 21, pp. 213902-1-213902-4, doi: 10.1103/PhysRevLett.92.213902.

Joshi et al., "Thermally controlled comb generation and soliton modelocking in microresonators", Optics Letters, Jun. 1, 2016, vol. 41, No. 11, pp. 2565-2568.

Jung et al., "In-resonator variation of waveguide cross-sections for dispersion control of aluminum nitride micro-rings", Optics Express, Nov. 30, 2015, vol. 23, No. 24, 7 pgs.

Karpov et al., "Universal dynamics and deterministic switching of dissipative Kerr solitons in optical microresonators", Nature Physics, Sep. 2016, pp. 1-6, doi 10.1038/nphyS3893.

Kim et al., "High-Performance Flexible Graphene Field Effect Transistors with ion Gel Gate Dielectrics", Nano Letters, 2010, vol. 10, pp. 3464-3466.

Kippenberg et al., "Microresonator-Based Optical Frequency Combs", Science, Apr. 29, 2011, vol. 332, pp. 555-559.

Kordts et al., "Higher order mode suppression in high-Q anomalous dispersion SiN microresonators for temporal dissipative Kerr soliton formation", Optics Letters, Feb. 1, 2016, vol. 41, No. 3, pp. 452-455.

Lamont et al., "Route to stabilized ultrabroadband microresonator-based frequency combs", Optics Letters, 2013, vol. 38, Issue 18, 5 pgs.

Lee, "Colloidal superlattices for unnaturally high-index metamaterials at broadband optical frequencies", Optics Express, Nov. 2, 2015, vol. 23, No. 22, published Oct. 19, 2015, pp. 28170-28181.

Li et al., "Optimization of adiabatic microring resonators with few-mode and high-Q resonances", Applied Optics, Dec. 2015, vol. 54, No. 34, pp. 10207-10212.

Liang et al., "High spectral purity Kerr frequency comb radio frequency photonic oscillator", Nature Communications, Aug. 11, 2015, vol. 6, No. 7957, pp. 1-8.

Liu et al., "Plasmon resonance enhanced multicolour photodetection by graphene", Nature Communications, Dec. 6, 2011, vol. 2, No. 579, pp. 1-7.

Manzoni et al., "Coherent pulse synthesis: towards sub-cycle optical waveforms", Laser & Photonics Reviews, 2015, vol. 9, No. 2, pp. 129-171.

Matsko et al., "On timing jitter of mode locked Kerr frequency combs", Optics Express, Nov. 15, 2013, vol. 21, No. 23, pp. 28862-28876.

Mikhailov et al., "A new electromagnetic mode in graphene", arXiv.org, Retrieved from: https://arxiv.org/abs/cond-mat/0703406, Mar. 15, 2007, 5 pgs.

Mikkelsen et al., "Adiabatically widened silicon microrings for improved variation tolerance", Optics Express, Apr. 15, 2014, vol. 22, No. 8, 8 pgs.

Ooi et al., "Waveguide engineering of graphene's nonlinearity", Applied Physics Letters, Sep. 18, 2014, vol. 105, pp. 111110-1-111110-4.

Papp et al., "Microresonator frequency comb optical clock", Optica, Jul. 22, 2014, vol. 1, No. 1, pp. 10-14.

Parra-Rivas et al., "Dynamics of localized and patterned structures in the Lugiato-Lefever equation determine the stability and shape of optical frequency combs", Physical Review A, Jan. 2014, vol. 89, pp. 043813-1-043813-12.

Parra-Rivas et al., "Third-order chromatic dispersion stabilizes Kerr frequency combs", arXiv.org, Retrieved from: https://arxiv.org/abs/1403.0903, Mar. 4, 2014, 5 pgs.

Pfeifle et al., "Coherent terabit communications with microresonator Kerr frequency combs", National Photonics, May 1, 2014, vol. 8, No. 5, pp. 375-380.

Roy et al., "Dynamics of periodic pulse collisions in a strongly dissipative-dispersive system", Physical Review Letters, May 27, 2005, vol. 94, No. 20, pp. 203903-1-203903-4, doi: 10.1103/PhysRevLett.94.203903.

Salem et al., "Application of space-time duality to ultrahigh-speed optical signal processing", Adv. Opt. Photon, 2013, vol. 5, No. 3, pp. 274-317.

Skryabin et al., "Colloquium: Looking at a soliton through the prisms of optical supercontinuum", Review of Modern Physics, vol. 82, Apr. 2010, pp. 1287-1299.

Solli et al., "Optical rogue waves", Nature, Dec. 13, 2007, vol. 450, pp. 1054-1057, doi: 10.1038/nature06402.

Song et al., "Impact of pulse dynamics on timing jitter in mode-locked fiber lasers", Optics Letters, May 2011, vol. 36, No. 10, 4 pgs.

Suh et al., "Soliton Microcomb Range Measurement", Science, Jun. 28, 2017, vol. 359, pp. 884-887.

Tamura et al., "77-fs pulse generation from a stretched-pulse mode-locked all-fiber ring laser", Optics Letters, 1993, vol. 18, No. 13, pp. 1080-1082, doi: 10.1364/OL.18.001080.

Trocha et al., "Ultrafast Optical Ranging Using Microresonator Soliton Frequency Combs", Science, Feb. 23, 2018, vol. 359, pp. 887-891.

Vakil et al., "Transformation optics using graphene", Science, Jun. 10, 2011, vol. 332, No. 6035, pp. 1291-1294.

(56) References Cited

OTHER PUBLICATIONS

Wabnitz, "Suppression of interactions in a phase-locked soliton optical memory", Optics Letters, Apr. 1993, vol. 18, No. 8, pp. 601-603.
Wei et al., "Precision and broadband frequency swept laser source based on high-order modulation-sideband injection-locking", Optics Express, Feb. 17, 2015, vol. 23, No. 4, pp. 4970-4980.
Wu et al., "Dissipative soliton resonance in an all-normal-dispersion erbium-doped fiber laser", Optics Express, Mar. 24, 2009, vol. 17, No. 7, pp. 5580-5584, doi: 10.1364/OE.17.005580.
Wu et al., "Generation of cascaded four-wave-mixing with graphene-coated microfiber", Photon. Res., Apr. 2015, vol. 3, No. 2, pp. A64-A68.
Xuan et al., "High-Q silicon nitride microresonators exhibiting low-power frequency comb initiation", Optica, Nov. 2016, vol. 3, No. 11, pp. 1171-1180.
Xue et al., "Mode-locked dark pulse Kerr combs in normal-dispersion microresonators", Nature Photonics, Aug. 10, 2015, vol. 9, 8 pgs., doi: 10.1038/nphoton.2015.137.
Yang et al., "An all-optical modulation method in sub-micron scale", Scientific Reports, vol. 5, No. 9206, Mar. 17, 2015, pp. 1-5.
Yao et al., "Graphene based widely-tunable and singly-polarized pulse generation with random fiber lasers", Scientific Reports, Dec. 21, 2015, vol. No. 18526, pp. 1-8.
Yao et al., "Graphene Bragg gratings on microfiber", Optics Express, Oct. 6, 2014, vol. 22, No. 20, pp. 23829-23835, published Sep. 22, 2014.
Yariv et al., "Critical Coupling and Its Control in Optical Waveguide-Ring Resonator Systems", IEEE Photonics Technology Letters, Apr. 2002, vol. 14, No. 4, pp. 483-485.
Yi et al., "Soliton frequency comb at microwave rates in a high-Q silica microresonator", Optica, Dec. 17, 2015, vol. 2, No. 12, pp. 1078-1085, doi: 10.1364/optica.2.001078.
Yu et al., "Dispersion-managed soliton interactions in optical fibers", Optics Letters, 1997, vol. 22, No. 11, pp. 793-795, doi: 10.1364/OL.22.000793.
Zhang et al., "Generation of two-cycle pulses and octave spanning frequency combs in a dispersion-flattened micro-resonator", Optics Letters, Dec. 1, 2013, vol. 38, No. 23, pp. 5122-5125.
Zhou et al., "Stability and intrinsic fluctuations of dissipative cavity solitons in Kerr frequency microcombs", IEEE Photonics Journal, Jun. 2015, vol. 7, No. 3, 13 pgs.
Extended European Search Report for European Application No. 17865633.6, Search completed Apr. 28, 2020, dated May 8, 2020, 10 pgs.
Extended European Search Report for European Application No. 17869363.6 Search completed Feb. 28, 2020, dated Mar. 9, 2020, 09 Pgs.
International Preliminary Report on Patentability for International Application PCT/US2018/048954, Report dated Mar. 3, 2020, dated Mar. 12, 2020, 5 Pgs.
International Preliminary Report on Patentability for International Application PCT/US2017/047413, Report dated Feb. 19, 2019, dated Feb. 28, 2019, 5 Pgs.
International Preliminary Report on Patentability for International Application PCT/US2017/059390, Report dated Apr. 30, 2019, dated May 9, 2019, 6 Pgs.
International Search Report and Written Opinion for International Application No. PCT/US2019/060128, Search completed Jan. 13, 2020, dated Jan. 28, 2020, 10 Pgs.
International Search Report and Written Opinion for International Application No. PCT/US2017/047413, Search completed Apr. 11, 2018, dated Apr. 26, 2018, 10 Pgs.
International Search Report and Written Opinion for International Application No. PCT/US2017/059390, Search completed Jan. 26, 2018, dated Feb. 9, 2018, 12 Pgs.
International Search Report and Written Opinion for International Application No. PCT/US2018/048954, Search completed Oct. 28, 2018, dated Nov. 15, 2018, 11 Pgs.

Aranson et al., "The World of the Complex Ginzburg-Landau Equation", Reviews of Modern Physics, Jan. 2002, vol. 74, pp. 99-143, doi: 10.1103/RevModPhys.74.99.
Bale et al., "Dissipative dispersion-managed solitons in mode-locked lasers", Optics Letters, Nov. 1, 2009, vol. 34, No. 21, pp. 3286-3288, doi: 10.1364/OL.34.003286.
Brasch et al., "Photonic Chip Based Optical Frequency Comb Using Soliton Cherenkov Radiation", Science, Jan. 22, 2016, vol. 351, No. 6271, pp. 357-360, doi: 10.1126/science.aad4811.
Capmany et al., "Microwave photonics combines two worlds", Nature Photonics, Jun. 1, 2007, vol. 1, pp. 319-330.
Chembo et al., "Modal expansion approach to optical-frequency-comb generation with monolithic whispering-gallery-mode resonators", Physics Review A, 2010, vol. A 82, pp. 0338011-03380118.
Chong et al., "All-normal-dispersion femtosecond fiber laser with pulse energy above 20 nJ", Optics Letters, Aug. 15, 2007, vol. 32, No. 16, pp. 2408-2410, doi: 10.1364/OL.32.002408.
Coen et al., "Modeling of octave-spanning Kerr frequency combs using a generalized mean-field Lugiato-Lefever model", arXiv.org, Retrieved from: https://arxiv.org/abs/1211.1697, Nov. 29, 2019, 4 pgs.
Coillet et al., "Azimuthal Turing Patterns, Bright and Dark Cavity Solitons in Kerr Combs Generated with Whispering-Gallery-Mode Resonators", IEEE Photonics Journal, Aug. 2013, vol. 5, No. 4, pp. 6100409-1-6100409-10.
Conforti et al., "Modulational instability in dispersion oscillating fiber ring cavities", Optical Letters, May 2014, vol. 39, pp. 4200-4203.
Cundiff et al., "Experimental evidence for soliton explosions", Physical Review Letters, Feb. 18, 2002, vol. 88, No. 7, pp. 073903-1-073903-4, doi: 10.1103/PhysRevLett.88.073903.
Del'Haye et al., "Full Stabilization of a Microresonator-Based Optical Frequency Comb", Physical Review Letters, vol. 1, No. 5, Aug. 1, 2008, pp. 053903-1-053903-4.
Del'Haye et al., "Phase-coherent microwave-to-optical link with a self-referenced microcomb", Nat. Photon, 2016, vol. 10, pp. 516-520.
Du et al., "Tunability Analysis of a Graphene-Embedded Ring Modulator", IEEE Photonics Technology Letters, Oct. 15, 2014, vol. 26, No. 20, pp. 2008-2011.
Dudley et al., "Instabilities, breathers and rogue waves in optics", Nature Photonics, Sep. 28, 2014, vol. 8, pp. 755-764, doi: 10.1038/nphoton.2014.220.
Gilbert et al., "Hydrogen Cyanide H13C14N Absorption Reference for 1530 nm to 1565 nm Wavelength Calibration—SRM 2519a", NIST Special Publication 260-137, Aug. 2005, 29 pgs.
Godey et al., "Stability analysis of the spatiotemporal Lugiato-Lefever model for Kerr optical frequency combs in the anomalous and normal dispersion regimes", Physical Review A, Jun. 2014, vol. 89, No. 6, pp. 063814-1-063814-21.
Grelu et al., "Dissipative solitons for mode-locked lasers", Nature Photonics, Feb. 1, 2012, vol. 6, 9 pgs., doi: 10.1038/nphoton.2011.345.
Gu et al., "Regenerative oscillation and four-wave mixing in graphene optoelectronics", Nature Photonics, Jul. 15, 2012, vol. 6, pp. 554-559.
Hanson, "Dyadic Green's Functions and Guided Surface Waves for a Surface Conductivity Model of Graphene", Journal of Applied Physics, 2008, vol. 103, pp. 064302-1-064302-8.
Haus et al., "Stretched-Pulse Additive Pulse Mode-Locking in Fiber Ring Lasers: Theory and Experiment", IEEE Journal of Quantum Electronics, Mar. 1995, vol. 31, No. 3, pp. 591-598, doi: 10.1109/3.364417.
Haus et al., "Structures for additive pulse mode locking", Journal of the Optical Society of America, Oct. 1991, vol. 8, No. 10, pp. 2068-2076, doi: 10.1364/josab.8.002068.
Hendry et al., "Coherent Nonlinear Optical Response of Graphene", Physical Review Letters, Aug. 27, 2010, vol. 105, pp. 097401-1-097401-4.
Herr et al., "Temporal solitons in optical microresonators", Nature Photonics, Feb. 2014, vol. 8, pp. 145-152, published online Dec. 22, 2013, doi: 10.1038/nphoton.2013.343.

(56) References Cited

OTHER PUBLICATIONS

Herr et al., "Universal formation dynamics and noise of Kerr-frequency combs in microresonators", Nature Photonics, Jun. 24, 2012, vol. 6, pp. 480-487.
Huang et al., "A broadband chip-scale optical frequency synthesizer at 2.7 x 10-16 relative uncertainty", Sciences Advances, Apr. 22, 2016, vol. 2, e1501489, pp. 1-7.
Huang et al., "A low-phase-noise 18 GHz Kerr frequency microcomb phase-locked over 65 THz", Scientific Reports, Aug. 27, 2015, vol. 5, No. 13355, pp. 1-7.
Huang et al., "Globally Stable Microresonator Turing Pattern Formation of Coherent High-Power THz Radiation on-Chip", Physical Review X, vol. 7, 2017, pp. 041002-1-041002-25.
Huang et al., "Mode-Locked Ultrashort Pulse Generation from on-Chip Normal Dispersion Microresonators", Physical Review Letters, Feb. 4, 2015, vol. 114, pp. 053901-1-053901-5, doi: 10.1103/PhysRevLett.114.053901.
Huang et al., "Phase stabilization of Kerr frequency comb internally without nonlinear optical interferometry", arXiv, Nov. 9, 2016, 30 pgs.
Alnis et al., "Thermal-noise-limited crystalline whispering-gallery-mode resonator for laser stabilization", Physical Review A, vol. 84, No. 011804(R), 2011, pp. 011804-1-011804-4, DOI: 10.1103/PhysRevA.84.011804.
Bao et al., "Nonlinear conversion efficiency in Kerr frequency comb generation", Optics Letters, vol. 39, No. 21, 2014, pp. 6126-6129, http://dx.doi.org/10.1364/OL.39.006126.
Bao et al., "Stretched cavity soliton in dispersion-managed Kerr resonators", Phys. Rev., Aug. 3, 2015, vol. A 92, pp. 023802-1-023802-7, DOI: 10.1103/PhysRevA.92.023802.
Birch et al., "An Updated Edlén Equation for the Refractive Index of Air", Metrologia, Jan. 1993, vol. 30, No. 3, pp. 155-162, DOI: 10.1088/0026-1394/30/3/004.
Bobroff, "Recent advances in displacement measuring interferometry", Meas. Sci. Technol., 1993, vol. 4, No. 9, pp. 907-926.
Bolotin et al., "Ultrahigh electron mobility in suspended graphene", Solid State Communications, 2008, vol. 146, Issues 9-10, pp. 351-355, available online Mar. 6, 2008, doi: 10.1016/j.ssc.2008.02.024.
Bonaccorso et al., "Graphene photonics and optoelectronics", Nature Photonics, Sep. 2010, vol. 4, pp. 611-622, published online Aug. 31, 2010, DOI:10.1038/nphoton.2010.186.
Chakraborty et al., "Gain modulation by graphene plasmons in aperiodic lattice lasers", Science, Jan. 15, 2016, vol. 351, Issue 6270, pp. 246-248, doi: 10.1126/science.aad2930.
Ciddor et al., "Refractive index of air: new equations for the visible and near infrared", Applied Optics, Mar. 20, 1996, vol. 35, No. 9, pp. 1566-1573, doi: 10.1364/AO.35.001566.
Cingoz et al., "Direct frequency comb spectroscopy in the extreme ultraviolet", Nature, Feb. 1, 2012, vol. 482, pp. 68-71.
Coddington et al., "Coherent Multiheterodyne Spectroscopy Using Stabilized Optical Frequency Combs", Physical Review Letters, Jan. 11, 2008, vol. 100, No. 1, pp. 013902-1-013902, DOI: 10.1103/PhysRevLett.100.013902.
Coddington et al., "Rapid and precise absolute distance measurements at long range", Nature Photonics, Jun. 2009, vol. 3, pp. 351-356, published online May 24, 2009, DOI: 10.1038/nphoton.2009.94.
Coen et al., "Modulational Instability Induced by Cavity Boundary Conditions in a Normally Dispersive Optical Fiber", Physical Review Letters, vol. 79, No. 21, Nov. 24, 1997, pp. 4139-4142.
Cole et al., "Soliton crystals in Kerr resonators", Nature Photonics, Sep. 25, 2017, vol. 11, pp. 671-676, DOI:10.1038/s41566-017-0009-z.
Cundiff et al., "Optical arbitrary waveform generation", Nature Photonics, vol. 4, Nov. 2010, Published Online: Oct. 29, 2010, pp. 760-765, DOI:10.1038/nphoton.2010.196.
Das et al., "Monitoring dopants by Raman scattering in an electrochemically top-gated graphene transistor", Nature Nanotechnology, Apr. 2008, vol. 3, pp. 210-215, published online Mar. 30, 2008, doi: 10.1038/nnano.2008.67.
Del'Haye et al., "Optical frequency comb generation from a monolithic microresonator", Nature, vol. 450, Dec. 20, 2007, pp. 1214-1217, arXiv:0708.0611, Aug. 4, 2007.
Del'Haye et al., "Phase Coherent Link of an Atomic Clock to a Self-Referenced Microresonator Frequency Comb", Nature, vol. 450, Dec. 20, 2007, 12 pgs.
Diddams et al., "An Optical Clock Based on a Single Trapped 199Hg+ Ion", Science, Aug. 3, 2001, vol. 203, pp. 825-828.
Diddams et al., "Direct Link between Microwave and Optical Frequencies with a 300 THz Femtosecond Laser Comb", Physical Review Letters, May 29, 2000, vol. 84, No. 22, pp. 5102-5105.
Diddams et al., "Standards of Time and Frequency at the Outset of the 21st Century", Science, vol. 306, Nov. 19, 2004, pp. 1318-1324.
Doloca et al., "Absolute distance measurement system using a femtosecond laser as a modulator", Measurement Science and Technology, Sep. 24, 2010, vol. 21, No. 11, 115302, 7 pgs.
Erkinatalo et al., "Cascaded Phase Matching and Nonlinear Symmetry Breaking in Fiber Frequency Combs", Physical Review Letters, Nov. 30, 2012, vol. 109, No. 2, first published Nov. 27, 2012, doi: 10.1103/PhysRevLett.109.223904.
Ferdous et al., "Spectral line-by-line pulse shaping of on-chip microresonator frequency combs", Nature Photonics, vol. 5, Dec. 2011, Published Online: Oct. 9, 2011, pp. 770-776, DOI:10.1038/nphoton.2011.255.
Fescenko et al., "Dual-mode temperature compensation technique for laser stabilization to a crystalline whispering gallery mode resonator", Optics Express, vol. 20, No. 17, Aug. 13, 2012, pp. 19185-19193, Published Aug. 6, 2012.
Gao et al., "Measurement technologies for precision positioning", CIRP Annals—Manufacturing Technology, 2015, vol. 64, Issue 2, pp. 773-796, available online Jun. 15, 2015, https://doi.org/10.1016/j.cirp.2015.05.009.
Giacomo, "News from the BIPM", Metrologia, 1984, vol. 20, No. 1, pp. 25-30.
Gohle et al., "A frequency comb in the extreme ultraviolet", Nature, Jul. 14, 2005, vol. 436, pp. 234-237, doi:10.1038/nature03851.
Grigorenko et al., "Graphene plasmonics", Nature Photonics, Nov. 5, 2012, vol. 6, pp. 749-758, published online Oct. 31, 2012, doi: 10.1038/nphoton.2012.262.
Han et al., "Parallel determination of absolute distances to multiple targets by time-of-flight measurement using femtosecond light pulses", Optics Express, Oct. 5, 2015, vol. 23, No. 20, pp. 25874-25882, published Apr. 23, 20015, doi: 10.1364/OE.23.025874.
Holzwarth et al., "Optical Frequency Synthesizer for Precision Spectroscopy", Physical review Letters, vol. 85, No. 11, Sep. 11, 2000, pp. 2264-2267.
Huang et al., "High-energy pulse synthesis with sub-cycle waveform control for strong-field physics", Nature Photonics, vol. 5, Aug. 2011, Published Online: Jul. 24, 2011, pp. 475-479, DOI: 10.1038/nphoton.2011.140.
Huang et al., "Universally stable microresonator Turing patters formation for coherent high-power THz radiation on-chip", 2016, arXiv:1603.00948, retrieved from https://www.semanticscholar.org/paper/Universally-stable-microresonator-Turing-pattern-Huang-Yang/da819648ba9b5225970c9d3cfd47fa716caf7a71, 26 pgs.
Ideguchi et al., "Coherent Raman spectro-imaging with laser frequency combs", Nature, Oct. 15, 2013, vol. 502, pp. 355-358.
Jang et al., "Absolute Distance Meter Operating on a Free-Running Mode-Locked Laser for Space Mission", International Journal of Precise Engineering and Manufacturing, 2018, vol. 19, No. 7, pp. 975-981.
Jang et al., "Comb-referenced laser distance interferometer for industrial nanotechnology", Comb-referenced laser distance interferometer for industrial nanotechnology, Scientific Reports, Aug. 25, 2016, vol. 6, No. 31770, pp. 1-10, DOI:10.1038/srep31770.
Jang et al., "Compensation of the refractive index of air in laser interferometer for distance measurement: A review", International Journal of Precision Engineering and Manufacturing, Dec. 2017, vol. 18, No. 12, pp. 1881-1890, DOI: 10.1007/s12541-017-0217-y.

(56) References Cited

OTHER PUBLICATIONS

Jin et al., "Absolute length calibration of gauge blocks using optical comb of a femtosecond pulse laser", Optics Express, Jun. 26, 2006, vol. 14, Issue 13, pp. 5968-5974, https://doi.org/10.1364/OE.14.005968.
Jones et al., "Carrier-Envelope Phase Control of Femtosecond Mode-Locked Lasers and Direct Optical Frequency Synthesis", Science, vol. 288, Apr. 28, 2000, pp. 635-639.
Joo et al., "Absolute distance measurement by dispersive interferometry using a femtosecond pulse laser", Optics Express, Jun. 26, 2006, vol. 14, No. 13, pp. 5954-5960.
Joo et al., "Distance measurements by combined method based on a femtosecond pulse laser", Optics Express, Nov. 24, 2008, vol. 16, No. 24, pp. 19799-19806, first published Nov. 14, 2008.
Kang etal, "Real-time compensation of the refractive index of air in distance measurement", Optics Express, Oct. 2015, vol. 23, No. 20, pp. 26377-26385, DOI: 10.1364/OE.23.026377.
Kim, "Metrology: combs rule", Nat. Photon, 2009, vol. 3, No. 6, pp. 313-314.
Kim et al., "Large-scale pattern growth of graphene films for stretchable transparent electrodes", Nature, Jan. 14, 2009, vol. 457, pp. 706-710, https://doi.org/10.1038/nature07719.
Kippenberg et al., "Dissipative Kerr solitons in optical microresonators", Science, Aug. 10, 2018, vol. 361, 567, 13 pgs., DOI:10.1126/science.aan.8083.
Koppens et al., "Photodetectors based on graphene, other two-dimensional materials and hybrid systems", Nature Nanotechnology, Oct. 2014, vol. 9, No. 10, pp. 780-793, doi:10.1038/nnano.2014.215.
Krausz et al., "Attosecond metrology: from electron capture to future signal processing", Nature Photonics, vol. 8, Mar. 2014, Published Online: Feb. 28, 2014, pp. 205-213, DOI: 10.1038/nphoton.2014.28.
Larkin et al., "Efficient nonlinear algorithm for envelope detection in white light interferometry", Journal Opt. Soc. Am. A. Apr. 1996, vol. 13, No. 4, pp. 832-843.
Lee et al., "Time-of-flight measurement with femtosecond light pulses", Nature Photonics, Oct. 2010, vol. 4, pp. 716-720, first published Aug. 8, 2010, DOI: 10.1038/nphoton.2010.175.
Lepetit et al., "Linear techniques of phase-measurement by femtosecond spectral interferometry for applications in spectroscopy", J. Opt. Soc. Am. B, Dec. 1995, vol. 12, No. 12, pp. 2467-2474.
Li et al, "Compact and stable temporally magnified tomography using phase-locked broadband source", Optics Letters, 2016, vol. 41, Issue 7, pp. 1562-1565, http://dx.doi.org/10.1364/OL.41.001562.
Li et al., "A laser frequency comb that enables radial velocity measurements with a precision of 1 cm s-1", Nature, vol. 452, Apr. 3, 2008, pp. 610-612, doi:10.1038/nature06854.
Li et al., "Dirac charge dynamics in graphene by infrared spectroscopy", Nature Physics, Jul. 2008, vol. 4, pp. 532-535, published online Jun. 8, 2008, doi:10.1038/nphys989.
Liu et al., "A graphene-based broadband optical modulator", Nature, May 11, 2011, vol. 474, pp. 64-67, doi:10.1038/nature10067.
Liu et al., "Investigation of mode coupling in normal-dispersion silicon nitride microresonators for Kerr frequency comb generation", Optica, vol. 1, No. 3, Sep. 2014, pp. 137-144, http://dx.doi.org/10.1364/optica.1.000137.
Liu et al., "Sub-micron absolute distance measurements in sub-millisecond times with dual free-running femtosecond Er fiber-lasers", Optics Express, Sep. 12, 2011, vol. 19, No. 19, pp. 18501-18509, first published Sep. 7, 2011.
Marin-Palomo et al., "Microresonator-based solitons for massively parallel coherent optical communications", Nature Jun. 8, 2017, vol. 546, pp. 274-279, DOI: 10.1038/nature22387.
Mikhailov et al., "New Electromagnetic Mode in Graphene", Physical Review Letters, Jul. 6, 2007, vol. 99, 016803, pp. 016803-1-016803-4, doi: 10.1103/PhysRevLett.99.016803.

Minoshima et al., "High-accuracy measurement of 240-m distance in an optical tunnel by use of a compact femtosecond laser", Applied Optics, Oct. 20, 2000, vol. 39, No. 30, pp. 5512-5517.
Moss et al., "New CMOS—compatible platforms based on silicon nitride and Hydex for nonlinear optics", Nature Photonics, Aug. 2013, vol. 7, pp. 597-607, published online Jul. 30, 2013, DOI:101038/nphoton2013/183.
Papp et al., "Parametric seeding of a microresonator optical frequency comb", Optics Express, vol. 21, No. 15, Jul. 29, 2013, pp. 17615-17624, doi:10.1364/oe.21.017615.
Phare et al., "Graphene electro-optic modulator with 30 GHz bandwidth", Nature Photonics, Aug. 2015, vol. 9, pp. 511-514, published online Jul. 13, 2015, doi: 10.1038/nphoton.2015.122.
Piglosiewics et al., "Carrier-envelope phase effects on the strong-field photoemission of electrons from metallic nanostructures", Nature Photonics, vol. 8, Jan. 2014, Published Online: Nov. 10, 2013, pp. 37-42, DOI:10.1038/nphoton.2013.288.
Saglamyurek et al., "Broadband waveguide quantum memory for entangled photons", Nature, Jan. 12, 2011, vol. 469, pp. 512-515, DOI:10.1038/nature09719.
Saha et al., "Modelocking and femtosecond pulse generation in chip-based frequency combs", Optics Express, vol. 21, No. 1, Jan. 14, 2013, pp. 1335-1343.
Schuhler et al., "Frequency-comb-referenced two-wavelength source for absolute distance measurement", Optics Letters, 2006, vol. 31, Issue 21, pp. 3101-3103, https://doi.org/10.1364/OL.31.003101.
Spencer et al., "An optical-frequency synthesizer using integrated photonics", Nature, 2018, vol. 557, pp. 81-85, https://doi.org/10.1038/s41586-018-0065-7.
Steinmetz et al., "Laser Frequency Combs for Astronomical Observations", Science, 2008, vol. 321, pp. 1335-1337.
Stern et al., "Battery-operated integrated frequency comb generator", Nature, Oct. 2018, vol. 562, No. 7727, pp. 401-405. Epub Oct. 8, 2018, doi: 10.1038/s41586-018-0598-9.
Suh et al., "Microresonator soliton dual-comb spectroscopy", Science, Nov. 4, 2016, vol. 354, Issue 6312, pp. 600-603, DOI: 10.1126/science.aah6516, arXiv:1607.08222, Jul. 27, 2016.
Udem et al., "Optical frequency metrology", Nature, Mar. 14, 2002, vol. 416, pp. 233-237.
Van Den Berg et al., "Many-wavelength interferometry with thousands of lasers for absolute distance measurement", Physical Review Letters, May 4, 2012, vol. 108, No. 18, pp. 183901-1-183901-5, DOI:10.1103/PhysRevLett.10/.183901.
Wang et al., "Absolute positioning by multi-wavelength interferometry referenced to the frequency comb of a femtosecond laser", Optics Express, Apr. 6, 2015, vol. 23, No. 7, pp. 9121-9129, first published Apr. 1, 2015, doi: 10.1364/OE.23.009121.
Wang et al., "Gate-Variable Optical Transitions in Graphene", Science, Apr. 11, 2008, vol. 320, pp. 206-209.
Wirth et al., "Synthesized Light Transients", Science, vol. 334, Oct. 14, 2011, pp. 195-200.
Wu et al., "Extremely high-accuracy correction of air refractive index using two-colour optical frequency combs", Scientific Reports, May 30, 2013, vol. 3, No. 1894, DOI: 10.1038/srep01894.
Xu et al., "Holey graphene frameworks for highly efficient capacitive energy storage", Nature Communications, Aug. 8, 2014, vol. 5, Article No. 4554, pp. 1-8, doi: 10.1038/ncomms5554.
Yang et al, "Counter-propagating solitons in microresonators", Nature Photonics, 2017, vol. 11, pp. 560-564, arX14:1704.08409, May 2, 2017.
Yang et al., "Stokes solitons in optical microcavities", Nature Physics, Jan. 2017, vol. 13, pp. 53-58, published Sep. 5, 2016, DOI: 10.1038/NPHYS3875.
Yao et al., "Gate-tunable frequency combs in graphene-nitride microresonators", Nature, Jun. 21, 2018, vol. 558, pp. 410-414, https://doi.org/10.1038/s41586-018-0216-x.
Ye et al., "Femtosecond Optical Frequency Comb Technology", Springer, New York, NY, 2005, 370 pgs., (presented in two parts).

* cited by examiner

| figure | Average period (ps) | Figure | Average period (ps) |
|---|---|---|---|
| aII | 11.5 | aIV | 11.5 |
| aIII | 11.6 | aIII | 11.7 |
| bII | 11.1 | aIIII | 11.6 |
| bIII | 11.8 | aIV | 11.6 |
| cII | 11.6 | aV | 11.7 |
| cIII | 11.5 | | |

Figure 13c

ADIABATIC DISPERSION-MANAGED FREQUENCY COMB GENERATION

CROSS REFERENCE TO RELATED APPLICATIONS

This application is a national stage of PCT Patent Application No. PCT/US2017/059390, entitled "Adiabatic Dispersion-Managed Frequency Comb Generation", filed Oct. 31, 2017, which claims priority to U.S. Provisional Application No. 62/415,291, entitled "Adiabatic Dispersion-Managed Frequency Comb Generation", filed Oct. 31, 2016, the disclosures of which are incorporated by reference herein in their entireties.

STATEMENT REGARDING FEDERALLY SPONSORED RESEARCH

This invention was made with Governmental support under Grant No. N00014-14-1-0041 awarded by the Office of Naval Research and Grant No. FA95500-15-1-0081 awarded by the Air Force Office of Scientific Research. The government has certain rights in the invention.

FIELD OF THE INVENTION

The invention is generally directed to methods and apparatus for the production of chip-scale dispersion-managed dissipative Kerr solitons in frequency combs, and their application in mode-locked and pulsed lasers.

BACKGROUND

The spontaneous formation of dissipative solitons and non-homogeneous solitary patterns from noise has analogues and lessons across wide disciplines such as developmental biology morphogenesis, chemical kinetics far-from equilibrium, formation of fractals and chaos, creation of optical rogue waves, and generation of space-time light bullets. (See, e.g., P. Grelu and N. Akhmediev, Nat. Photon. 6, 84 (2012); J. M. Dudley, et al., Nat. Photon. 8, 755 (2014); and D. R. Solli, et al., Nature 450, 1054 (2007), the disclosures of which are incorporated herein by reference.) Due to the readily accessible parameter space, mode-locked lasers have been utilized as a useful platform to observe supercritical and subcritical bifurcations. This includes the study of nonlinear dissipative dynamics where Kerr nonlinearity is balanced by cavity dispersion, and cavity loss is compensated by nonlinear gain and spectral filtering. (See, e.g., H. A. Haus, J. G. Fujimoto, and E. P. Ippen, J. Opt. Soc. Am. B 8, 2068 (1991); and I. S. Aranson and L. Kramer, Rev. Mod. Phys. 74, 99 (2002), the disclosures of which are incorporated herein by reference.) The investigation has led to the discovery of soliton explosion, the synthesis and dissociation of soliton molecules, and the invention of novel mode-locked lasers with unprecedented pulse energy and output stability. (See, e.g., S. T. Cundiff, J. M. Soto-Crespo, and N. Akhmediev, Phys. Rev. Lett. 88, 073903 (2002); V. Roy, M. Olivier, F. Babin, and M. Piché, Phys. Rev. Lett. 94, 203903 (2005); K. Tamura, et al., Opt. Lett. 18, 1080 (1993); Phys. Rev. Lett. 92, 213902 (2004); A. Chong, W. H. Renninger, and F. W. Wise, Opt. Lett. 32, 2408 (2007); X. Wu, et al., Opt. Express 17, 5580 (2009), the disclosures of which are incorporated herein by reference.) Such dispersion management techniques have the potential to broaden the scope of mode-locking physics, and solve the high-energy pulse break-up problem induced by excessive accumulated non-linear phase, a serious limit in traditional cavities where pulses propagate statically. (See, e.g., H. A. Haus, et al., IEEE J. Quant. Electron. 31, 591 (1995); T. Yu, et al., Opt. Lett. 22, 793 (1997); and B. Bale, S. Boscolo, and S. Turitsyn, Opt. Lett. 21, 3286 (2009), the disclosures of which are incorporated herein by reference.

SUMMARY OF THE INVENTION

Embodiments are directed to a microresonator-based optical frequency comb, including:
an optical pump configured to generate pulses of light; and
a microresonator cavity comprising:
an input waveguide configured to receive pulses generated by the optical pump,
a microring waveguide having an adiabatically tapered width configured to generate a Kerr frequency comb producing single-mode, dispersion-managed dissipative Kerr solitons;
a coupling region for coupling the pulses from the input waveguide into the microring waveguide, and
an output waveguide configured to output pulses generated by the microring waveguide.

In other embodiments, the microresonator is formed of a $Si_3N_4$ material.

In still other embodiments, the varying width of the microring waveguide is configured to induce an oscillating group velocity dispersion to the pulses along the microresonator cavity.

In yet other embodiments, the oscillating group velocity dispersion is configured as a Gaussian-like optical spectrum.

In still yet other embodiments, the input waveguide and the microring waveguide in the coupling region are configured to be single-mode.

In still yet other embodiments, the dispersion is a third-order dispersion effect.

In still yet other embodiments, the optical pump comprises an external cavity diode laser (ECDL).

In still yet other embodiments, the microresonator is configured to operate in a stretched-pulse mode at close-to-zero net cavity group velocity dispersion.

In still yet other embodiments, the coupling of the pulses of light into the microring waveguide is approximately critical.

Other embodiments, are directed to microresonator including a microring waveguide having an adiabatically tapered width configured to generate a Kerr frequency comb producing single-mode, dispersion-managed dissipative Kerr solitons.

In still other embodiments, the microresonator is formed of a $Si_3N_4$ material.

In yet other embodiments, the varying width of the microring waveguide is configured to induce an oscillating group velocity dispersion to the pulses along the microresonator cavity.

In still yet other embodiments, the oscillating group velocity dispersion is configured as a Gaussian-like optical spectrum.

In still yet other embodiments, the input waveguide and the microring waveguide in the coupling region are configured to be single-mode.

In still yet other embodiments, the dispersion is a third-order dispersion effect.

Still other embodiments are directed to methods of manufacturing a microresonator including:

depositing a under-cladding oxide atop a semi-conductive chip substrate;

depositing a $Si_3N_4$ layer atop the under-cladding oxide;

lithographically patterning and etching the $Si_3N_4$ layer to form a dispersion-managed microring waveguide having an adiabatically tapered width;

annealing the waveguide; and over-cladding the microresonator with an oxide layer.

In other embodiments, at least one adiabatic mode converter is disposed between the microresonator and a bus waveguide.

Yet other embodiments are directed to methods of forming single-mode, dispersion-managed dissipative Kerr solitons including:

injecting pulses of light into a microresonator cavity comprising:

an input waveguide configured to receive pulses generated by the optical pump, a microring waveguide having an adiabatically tapered width configured to generate a Kerr frequency comb;

a coupling region for coupling the pulses from the input waveguide into the microring waveguide, and an output waveguide configured to output soliton pulses generated by the microring waveguide.

In other embodiments, the varying width of the microring waveguide is configured to induce an oscillating group velocity dispersion to the pulses along the microresonator cavity.

In still other embodiments, the oscillating group velocity dispersion is configured as a Gaussian-like optical spectrum.

In many embodiments the invention is directed to methods and apparatus for producing dispersion-managed dissipative solitons.

Various embodiments are directed to chip-scale dispersion-managed dissipative Kerr solitons comprising an adiabatically tapered waveguide.

Other embodiments are directed to microresonators including a waveguide having varying widths configured to provide an oscillating group velocity dispersion (GVD) along a cavity.

Still other embodiments are directed to microresonators wherein the waveguide is formed of formed $Si_3N_4$.

Yet other embodiments are directed to microresonators wherein the resonator is further configured to suppress the mode-hybridization induced perturbation to dissipative soliton generation.

Still other embodiments are directed to microresonators wherein the microresonator comprises a bus waveguide and a cavity waveguide, and wherein both waveguides are configured to be single-mode within a coupling region.

Still yet other embodiments are directed to methods of forming stable solitons and soliton pulses using an adiabatically-tapered resonator.

Still yet other embodiments are directed to methods of forming multiple-soliton one or more of light pulses, equally-spaced light pulses, and non-equally spaced light pulses using an adiabatically-tapered resonator.

Still yet other embodiments are directed to methods of overcoming a high-energy pulse breakup in an adiabatically-tapered resonator.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings, which forms a part of this disclosure.

BRIEF DESCRIPTION OF THE DRAWINGS

The description and claims will be more fully understood with reference to the following figures and data graphs, which are presented as exemplary embodiments of the invention and should not be construed as a complete recitation of the scope of the invention.

FIGS. 13a to 13e provide periods of the dissipative Kerr soliton molecules, where: a) shows the doublet soliton state; b) shows the soliton crystal made of equidistant soliton pair; c) provides a table summarizing the average periods for different types of soliton molecules; d) shows the triplet soliton state; and e) shows the quadruplet soliton state.

DETAILED DESCRIPTION

Figure 1A:
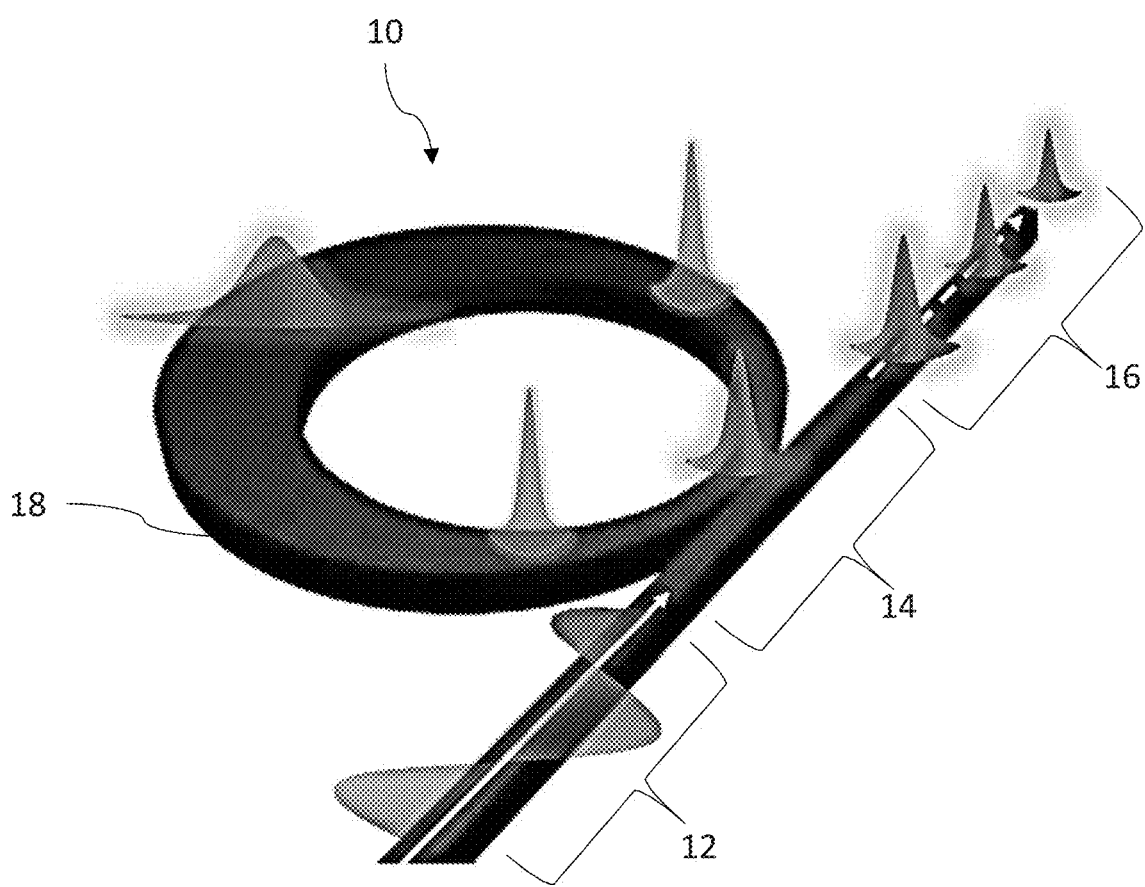
FIGS. 1a to 1g provide results of tests on dispersion-managed dissipative Kerr soliton generation with adiabatically tapered $Si_3N_4$ microring according to embodiments where: a) is a conceptual schematic of a tapered $Si_3N_4$ microring and the breathing pulse evolution along the cavity according to embodiments, where the varying widths of the cavity waveguide provide the oscillating group velocity dispersion (GVD); b) is a data plot of the cold cavity transmission of the tapered $Si_3N_4$ microring, measured with high resolution coherent swept wavelength interferometer (SWI) (existence of higher order transverse modes is not observed across the wavelength region of interest and Q factors and wavelength-dependent free spectral range (FSR) are determined from the transmission measurement); c) is a COMSOL modeled GVD and third-order dispersion (TOD) of the $Si_3N_4$ waveguide with respect to the waveguide width, taking into consideration both the waveguide dimensions and the material dispersion (at the pump wavelength of 1598.5 nm, the path-averaged GVD and TOD are −2.6 $fs^2$/mm and −397 $fs^3$/mm respectively)(note the red dots are the measured GVD for waveguides with widths of 1.2 μm, 1.5 μm, and 1.6 μm, showing good agreements with the simulation results); d) wavelength dependence of the FSR, determining residual non-equidistance of the modes, $D=-\beta 2\omega^2_{FSR}c/n$, of 33±9 kHz (the extracted GVD is anomalous at −4.3±1.2 $fs^2$/mm, in a good agreement with simulation results); e) is the RF amplitude noise of the Kerr frequency comb at different states, showing the transition into the low-phase noise state with the amplitude noise reaching the detector background (the 5 GHz scan range is more than 50 times the cavity linewidth); f) is the the optical spectrum of the dispersion-managed dissipative Kerr soliton, better fitted with a Gaussian profile (red curve) rather than a sech2 profile (green curve) (inset: a photo of the generation setup); and g) shows the intracavity waveforms obtained by numerically solving the mean-field Lugiato-Lefever equation (with the close-to-zero GVD, randomly spaced pulses are first observed (top) but then reorganized into a single dissipative Kerr soliton when the TOD is added (bottom)).

Turning now to the drawings and data, methods and apparatus for providing dispersion-managed dissipative Kerr solitons on-chip are provided. Many embodiments provide microresonators for producing such solitons. In many embodiments, the microresonators incorporate real-time dynamical measured frequency combs. In various embodiments, methods and apparatus are provided to determine the temporal structure of the intracavity field in both the fast time axis, with ultrafast time-lens magnifiers at 600 fs timing resolutions, and the slow time axis via optical sampling with a synchronized fiber frequency comb reference. Other embodiments provide methods and apparatus for capturing real-time transitions from chaotic oscillations to multiple solitons to the singlet soliton state without ejection of excessive intracavity power. In various embodiments, an order-of-magnitude enlarged stability zone of the dispersion-managed dissipative Kerr solitons is achieved versus the static regimes.

Parametric oscillation in ultrahigh Q microresonators, facilitated by the high Q factors and small mode volumes, has emerged as an alternative physical platform that offers the opportunity of dissipative soliton generation in compact footprints. (See, e.g., T. Herr, et al., Nat. Photon. 8, 145 (2014); S.-W. Huang, et al., Phys. Rev. Lett. 114, 053901 (2015); X. Xue, et al., Nat. Photon. 9, 594 (2015); X. Yi, et al., Optica 2, 1078 (2015); V. Brasch, et al., Science 351, 357 (2016); C. Joshi, et al., Opt. Lett. 41, 2565 (2016); H. Guo et al, Nat. Phys. advance online publication, 26 Sep. 2016 (doi 10.1038/nphyS3893), the disclosures of which are incorporated here by reference.) Several dissipative soliton states can be observed as the driving laser frequency or power is tuned in these Kerr-active microresonators. This includes, first, spontaneous Turing pattern formation, followed by destabilization into spatio-temporal chaos, and eventual transition into soliton or soliton molecules. (See, e.g., Y. K. Chembo and N. Yu, Phys. Rev. A 82, 033801 (2010); M. R. E. Lamont, Y. Okawachi, and A. L. Gaeta, Opt. Lett. 38, 3478 (2013); C. Godey, et al., Phys. Rev. A 89, 063814 (2014); and H. Zhou et al., IEEE Photon. J. 7, 1 (2015), the disclosures of which are incorporated here by reference.) Static dissipative solitons have been observed and characterized in both the anomalous dispersion and normal dispersion regimes. (See citations above.) Dispersion-managed dissipative solitons are also theoretically studied in these Kerr-active resonators, predicting superior pulse energy and improved output stability. (See, M. Conforti, et al., Opt. Lett. 39, 4200 (2014); and C. Bao and C. Yang, Phys. Rev. A 92, 023802 (2015), the disclosures of which are incorporated here by reference.) Dissipative solitons, the fundamental phenomena in a wide range of non-integrable and non-conservative systems, offer an exciting platform for arbitrary optical waveform generation, broadband frequency synthesis, miniaturized frequency clockwork and coherent terabit communications. Breathing pulse evolution, through dispersion management, provide a new outlook in mode-locking physics, overcoming limits in traditional cavities where pulses propagate statically.

Embodiments are directed to methods and on-chip dissipative solitons that incorporate nonlinear dynamics and photonic frequency combs (see, T. J. Kippenberg, R. Holzwarth, and S. A. Diddams, "Microresonator-based optical frequency combs", Science 332, 555 (2011)), with exciting applications in low-phase noise photonic oscillators (see, S.-W. Huang, et al., Sci. Rep. 5, 13355 (2015) & W. Liang, et al., Nat. Commun. 6, 7957 (2015)), broadband optical frequency synthesizers (S.-W. Huang, J. Yang, et al., Sci. Adv. 2, e1501489 (2016) & P. Del'Haye, et al., Nat. Photon. 10, 516 (2016)), miniaturized optical clockwork (S. B. Papp, et al., Optica 1, 10 (2014)), and coherent terabit communications (J. Pfeifle, et al., Nat. Photon. 8, 375 (2014)).

Many embodiments are herein directed to chip-scale dispersion-managed dissipative Kerr solitons, utilizing an adiabatically tapered microring waveguide microresonator design where single-mode operation, high quality factor, and dispersion management are attained simultaneously. FIG. 1a depicts a schematic of an exemplary embodiment of a microresonator formed in the embodiment of $Si_3N_4$, the microresonator (10) generally consisting of an input waveguide (12), a coupling region (14), an output waveguide (16), and a microring waveguide (18) with varying widths to provide the oscillating group velocity dispersion (GVD) along the cavity. In embodiments, the GVD changes from being anomalous at −59 $fs^2$/mm to being normal at +58 $fs^2$/mm (as shown in FIG. 1c), resulting in temporal stretching and compression of the intra-cavity pulse within each round-trip. Through correlated transmission measurements, it can be shown that the dispersion-managed dissipative Kerr soliton sustains more pulse energy than its static counterpart in traditional homogeneous microresonators. Furthermore, the measured optical spectrum shows a clear deviation from the $sech^2$ shape characteristic of static soliton, with observed asymmetry due to the third-order dispersion (TOD) effect. The varying GVD renders itself in the flatter Gaussian spectral shape. Embodiments also utilize an ultrafast temporal magnifier (UTM) to depict the soliton molecules and portray the transition dynamics for the first time, illustrating the complex bifurcation evolution of the dissipative Kerr solitons. (For additional information regarding UTM see, R. Salem, M. A. Foster, and A. L. Gaeta, Adv. Opt. Photon. 5, 274 (2013) & B. Li, et al., Opt. Lett. 41, 1562 (2016), the disclosures of which are incorporated here by reference.)

Embodiments of the $Si_3N_4$ microresonator design not only provide the oscillating GVD along the cavity, but also suppresses the mode-hybridization induced perturbation to dissipative soliton generation. Both the bus waveguide and the cavity waveguide in the coupling region are designed to be strictly single-mode, thereby ensuring selective excitation of the fundamental mode and suppressing other transverse mode families. Exemplary cavity transmission around the pump mode is plotted in FIG. 1b, with no observable higher order transverse modes in the transmission spectrum. In many embodiments close to critical coupling is attained, with a loaded Q of $1.9 \times 10^6$ and a cavity loading of 90% at the pump mode. The exemplary GVD and TOD shown in FIG. 1c are calculated with a commercial full-vectorial finite-element-method solver (COMSOL Multiphysics), taking into consideration both the cavity geometry and the material dispersion. The path-averaged GVD is slightly anomalous at −2.6 $fs^2$/mm, leading to the intracavity pulse dynamics in the stretched-pulse regime. Operation in the stretched-pulse regime with close-to-zero GVD has been demonstrated in femtosecond mode-locked fiber lasers to be beneficial for achieving narrow linewidth, low phase noise, and attosecond timing jitter, important merits for advancing microwave photonics and coherent pulse synthesis. (See, Y. Song, K. Jung, and J. Kim, Opt. Lett. 36, 1761 (2011) & J. Capmany and D. Novak, Nat. Photon. 1, 319 (2007), the disclosure of which is incorporated herein by reference.) Similar timing jitter reduction from decreasing the net cavity dispersion may also be used in embodiments of Kerr-active resonators. To verify the designed close-to-zero GVD of embodiments, a high-resolution coherent swept wavelength interferometer (SWI) may be used to characterize the cold cavity properties of the $Si_3N_4$ microresonator embodiments. With active control of the on-chip temperature, passive shielding against acoustic noise and precise calibration with hydrogen cyanide gas standard, the SWI provides a GVD accuracy of 1.2 $fs^2$/mm, determined as the standard deviation calculated from 10 independent measurements. The mean value of the net cavity GVD from the 10 measurements is −4.3 $fs^2$/mm (FIG. 1d).

Figure 1B:
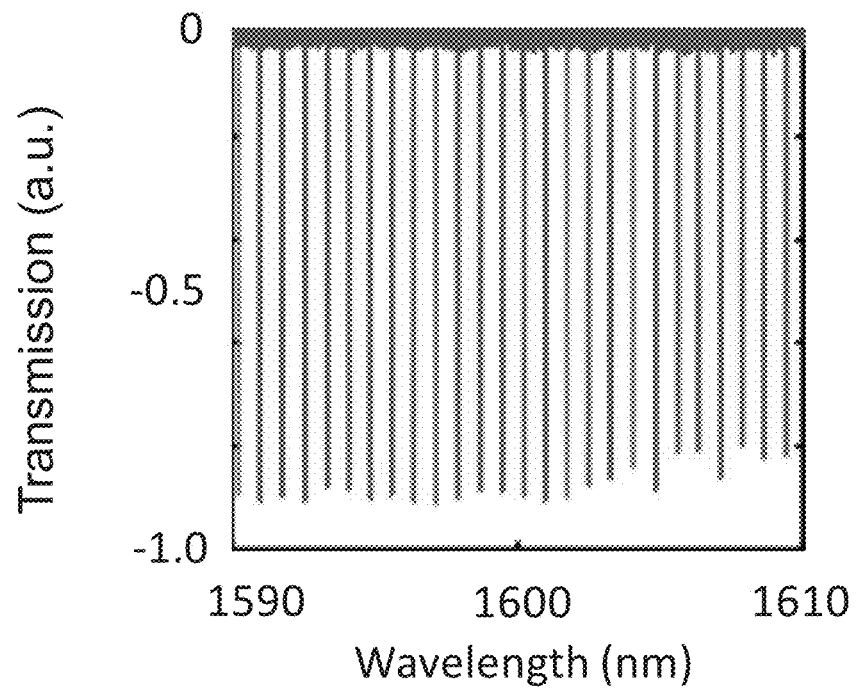
Figure 1C:
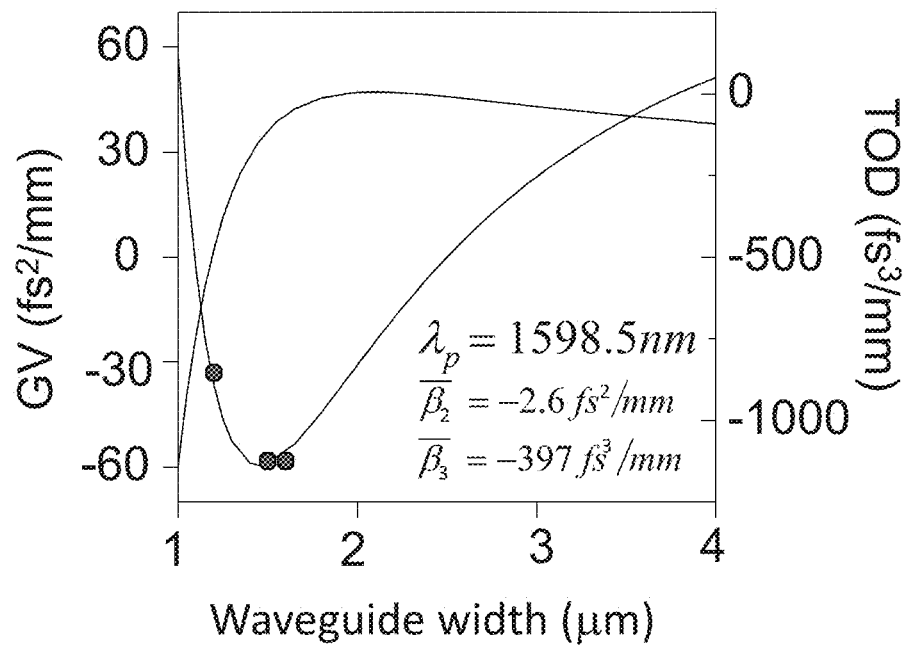
Figure 1D:
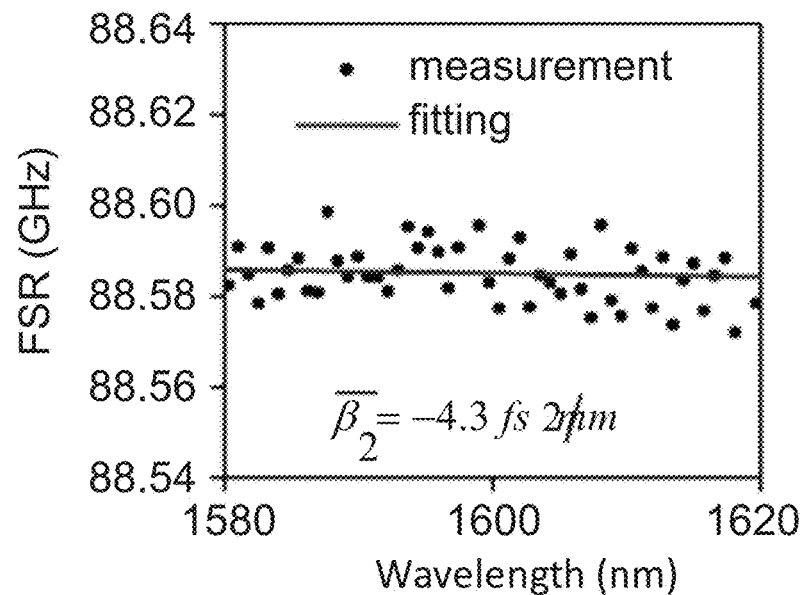
Figure 1E:
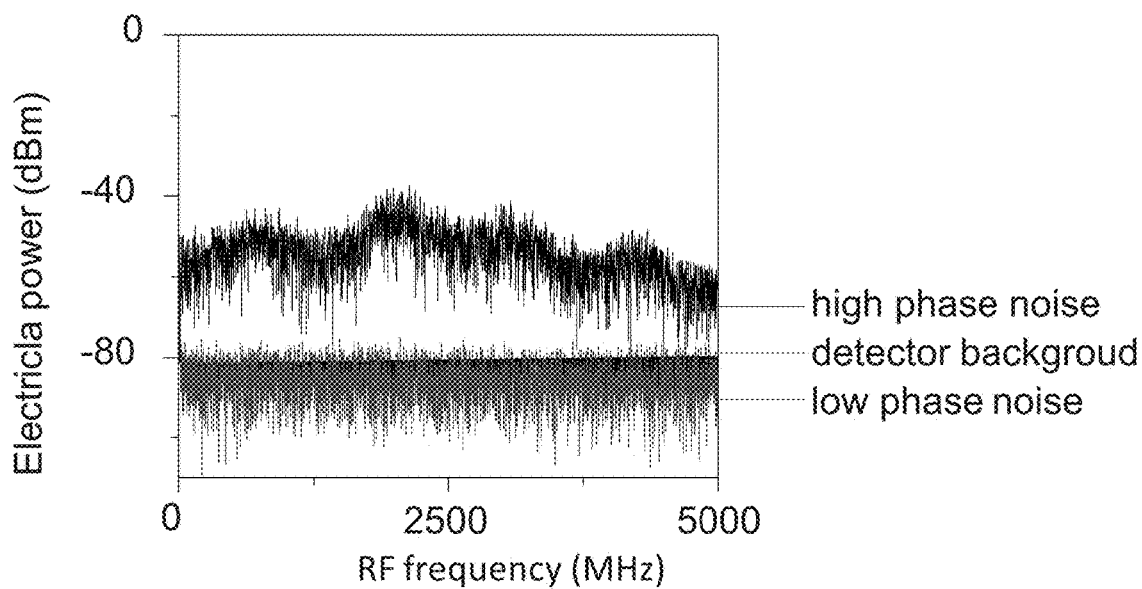
Figure 1F:
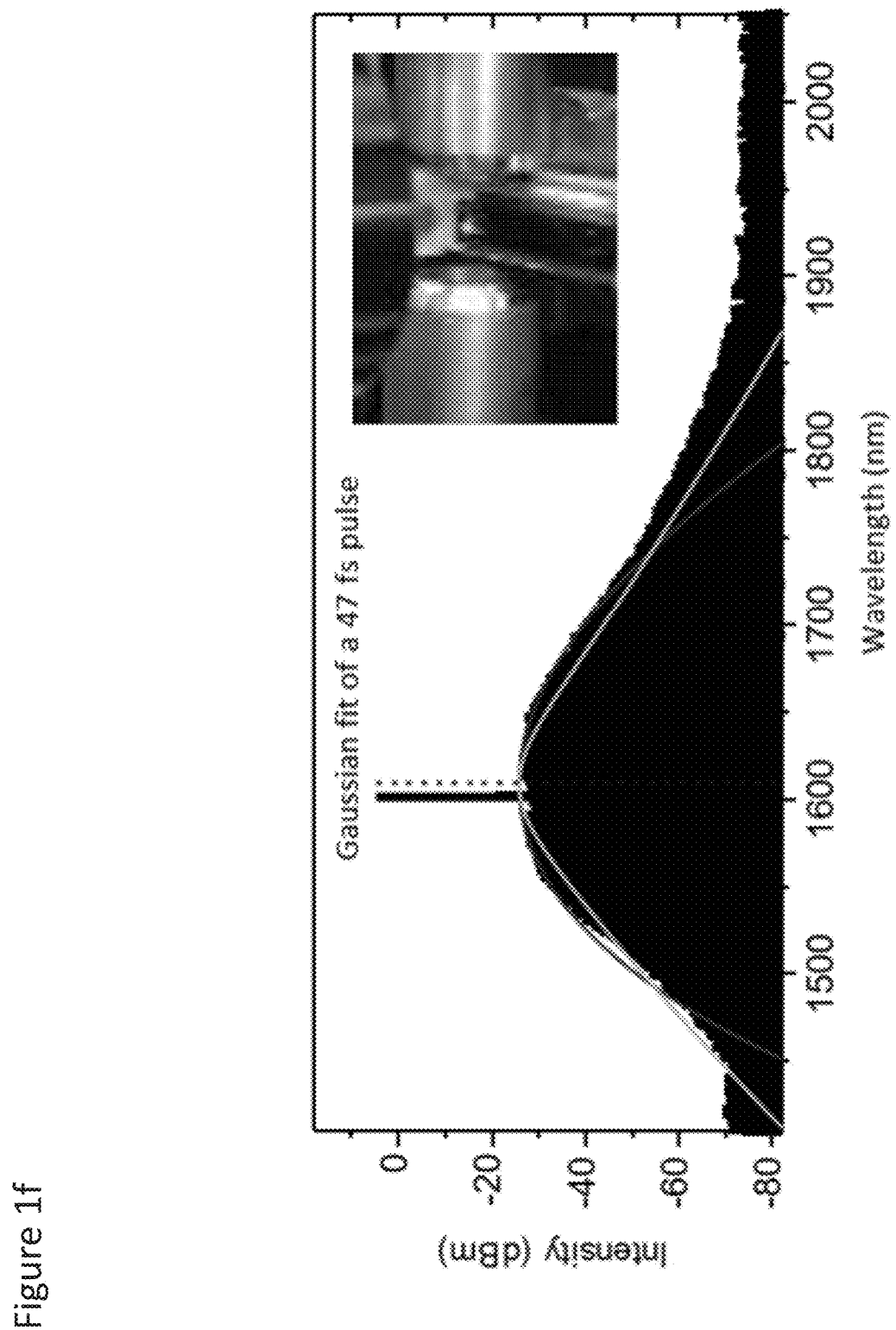
Figure 1G:
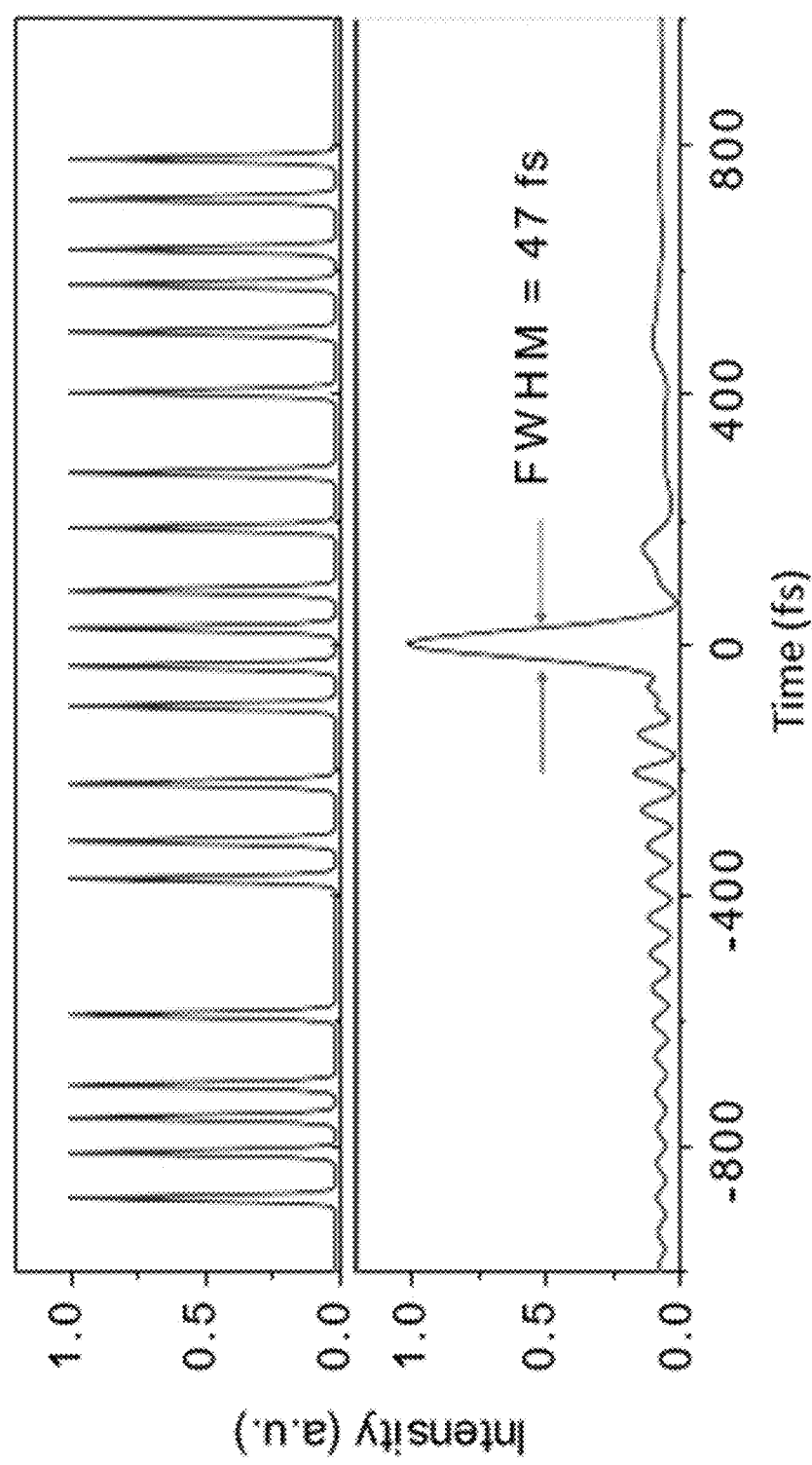

Tuning the pump frequency into the cavity resonance from the blue side with a scan speed of 3.5 THz/s, stable dispersion-managed dissipative Kerr soliton is observed with the measured RF amplitude noise spectrum approaching the detector background (FIG. 1e). The measured optical spectrum fits well with the Gaussian profile (red line) rather than the squared hyperbolic shape (green line), indicative of the stretched-pulse operation (FIG. 1f). While the squared hyperbolic spectral shape may be better for self-referenced Kerr frequency combs, the more equalized close-to-pump comb power spectral density of the Gaussian-like spectrum is advantageous for applications such as astrospectrograph calibration and high capacity coherent communication. Furthermore, the TOD effect is augmented due to the close-to-zero GVD, resulting in observed asymmetry in the optical spectrum and carrier frequency shift (blue dashed line) from the pump. Here the relative strength of the TOD, d3 as defined in (P. Parra-Rivas, et al., Opt. Lett. 39, 2971 (2014), the disclosure of which is incorporated herein by reference), is as high as 1.8 and it has been shown through numerical analysis that such TOD in Kerr-active resonators leads to suppression of oscillatory and chaotic instability. Similar to the stabilization effect introduced by the dispersion management, the augmented TOD strength expands the stability zone of the dissipative Kerr soliton through breaking the reflection reversibility. By numerically solving the mean-field Lugiato-Lefever equation (LLE), which describes the dynamics of the dissipative Kerr soliton, it is shown that randomly spaced pulses (top of FIG. 1g) reorganize themselves into a single dissipative Kerr soliton when the TOD is added to embodiments of the microresonator (bottom of FIG. 1g). The numerically attained pulse duration of 47 fs is in a good agreement with the transform-limited pulse duration expected from the measured optical spectrum.

Figure 2A:
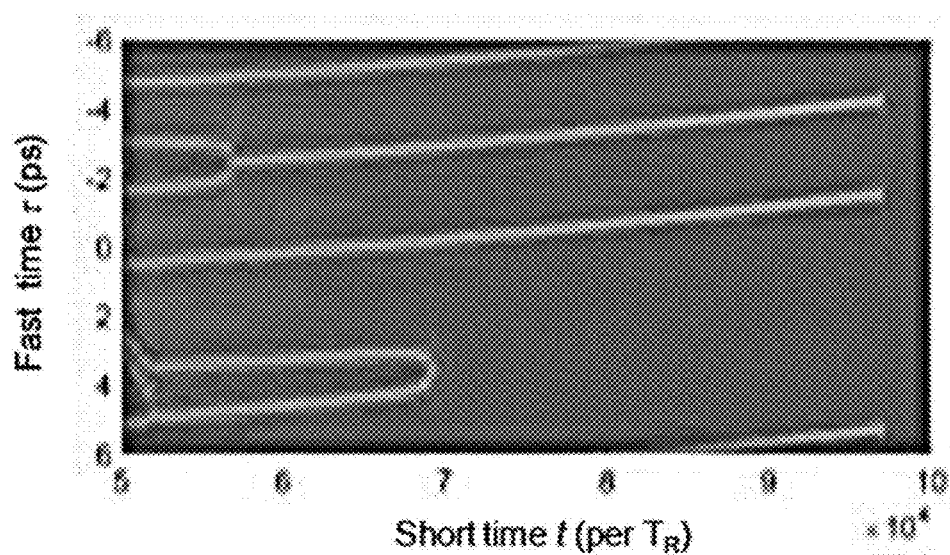
FIGS. 2a to 2d provide results of studies of the evolution and transition dynamics with ultrafast temporal magnifier in accordance with embodiments where: a) is a LLE modeled dissipative Kerr soliton dynamics including features such as soliton collision, soliton annihilation and soliton fusion (where TR is the round-trip time of the cavity) according to embodiments; b) is a conceptual schematic of and ultrafast temporal magnifier (UTM), a time-domain counterpart of a high-speed digital microscope system; c) is a schematic setup of the UTM system according to embodiments; d (left graph)) shows the total power transmission as the pump frequency is scanned across a cavity resonance at a speed of 2.1 THz/s for a pump power on-chip at 30 dBm (the step signature is characteristic of the low-phase noise soliton state (state 2)); d (right graph)) shows the dissipative Kerr soliton dynamics around these transmission steps studied and portrayed with the UTM system.
Figure 2B:
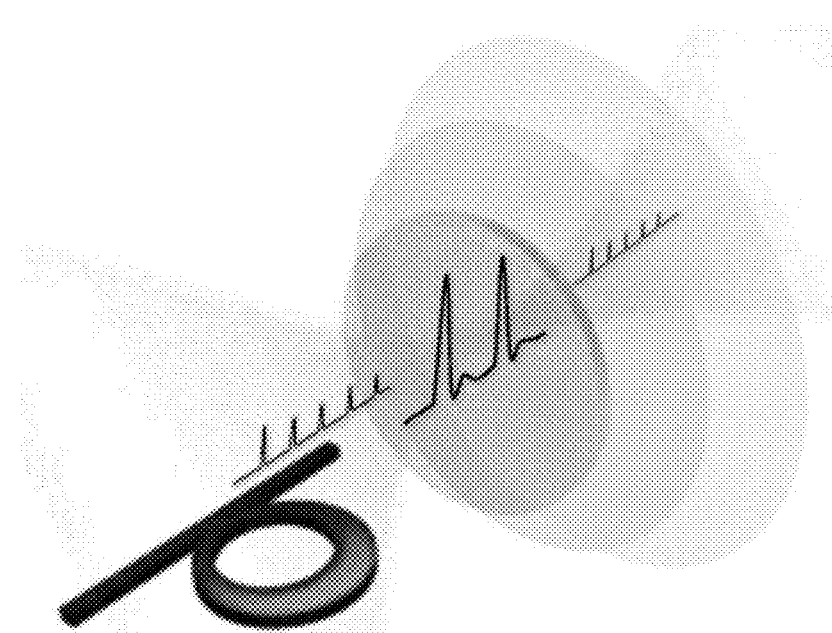

In the LLE formalism given by:

$$T_R \frac{\delta A(t,\tau)}{\delta t} = \left[-\alpha - i\delta + iL \sum_{k\geq 2} \frac{\beta_k}{k!}\left(i\frac{\delta}{\delta_\tau}\right)^k + i\gamma L|A|^2\right]A + \sqrt{TA_P}; \quad (\text{EQ. 1})$$

where $T_R$, L, $\alpha$, T, $\gamma$, and $\delta$ are the roundtrip time, cavity length, cavity loss, coupling loss, Kerr nonlinear coefficient, and pump-resonance detuning respectively, the dissipative Kerr soliton dynamics is depicted in a two-dimensional space spanning by the fast time $\tau$ and the slow time t. While the temporal structure of the intracavity field, $A(t,\tau)$, is detailed in the $\tau$ dimension at the sub-picosecond time scale, the evolution and transition dynamics is portrayed in the t dimension at a much slower sub-microsecond time scale, which is associated with the cavity photon time of the microresonator (FIG. 2a). The orders-of-magnitude difference in the time scale between the two time dimensions poses an experimental challenge to capture the comprehensive picture of dynamics. According to embodiments UTMs may be used to fully characterize the evolution and transition dynamics of the dissipative Kerr solitons. UTM is the time-domain counterpart of a high-speed digital microscope system, utilizing the space-time duality principle where diffraction in space and dispersion in time share the same mathematical expression (FIG. 2b). In the figure according to embodiments, the elements are as follows ECDL: external cavity diode laser; WDM: wavelength-division multiplexing; EDFA: erbium-doped fiber amplifier; AWG: arbitrary waveform generator; EOM: electro-optic modulator; PD: photodetector; D1, D2, and Df are the dispersions for the UTMs.

Figure 2C:
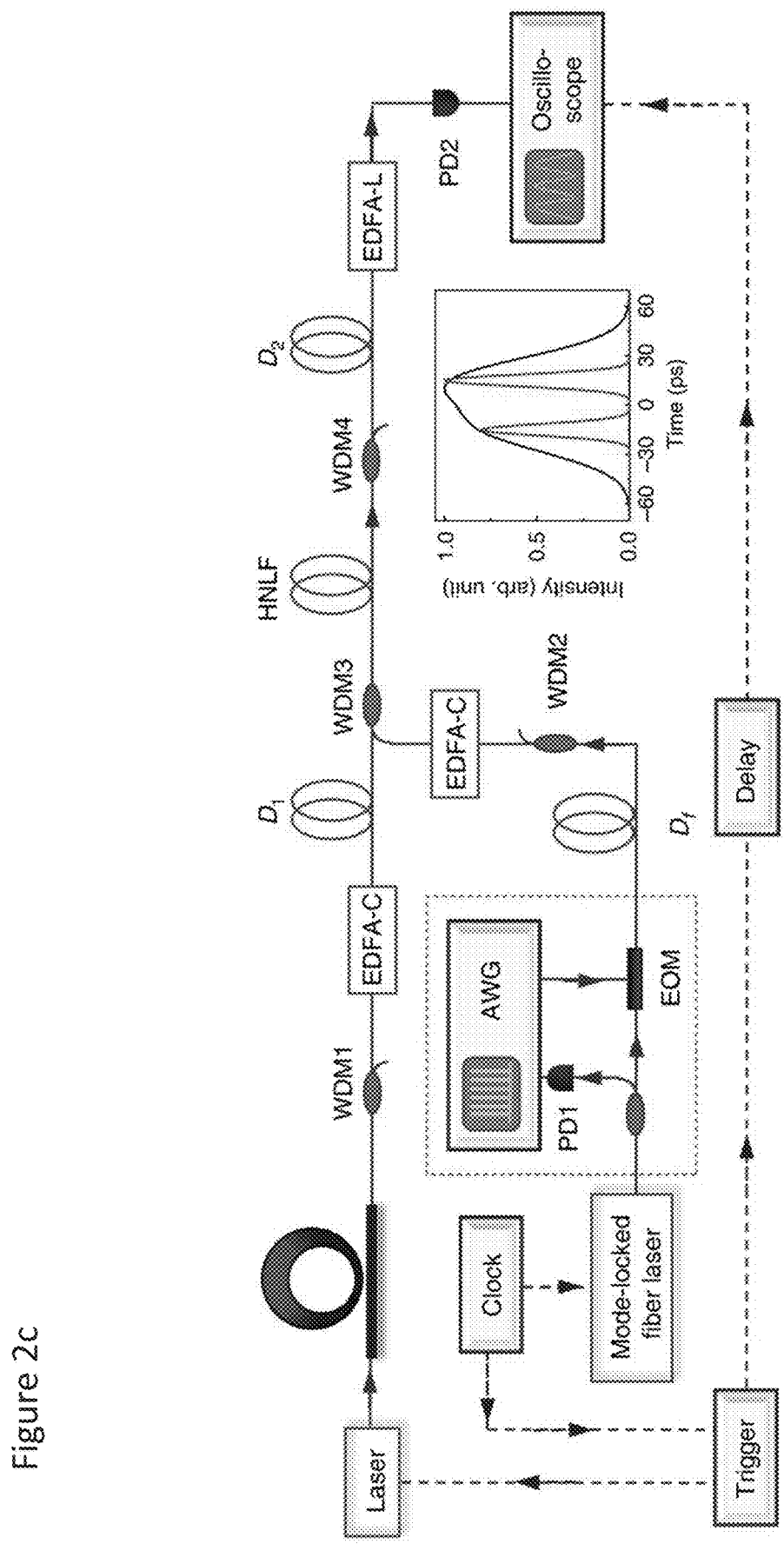

Along the fast time axis, the temporal structure of the intracavity field is magnified and captured by a real-time oscilloscope. Incorporating suitable GVDs (D1 and D2) before and after the four-wave mixing stage in the highly nonlinear fiber (HNLF), a temporal magnification of 72× and a time resolution of 600 fs is attained in our UTM for detailed depiction of the dissipative Kerr soliton's temporal structure. Along the slow time axis, the evolution and transition dynamics is sampled optically with a synchronized and stabilized femtosecond mode-locked fiber laser. The frame rate of 250 MHz, higher than the cavity resonance linewidth of 100 MHz, is determined by the laser repetition rate stabilized to an Rb-disciplined crystal oscillator (as shown in FIG. 2c).

Figure 2D:
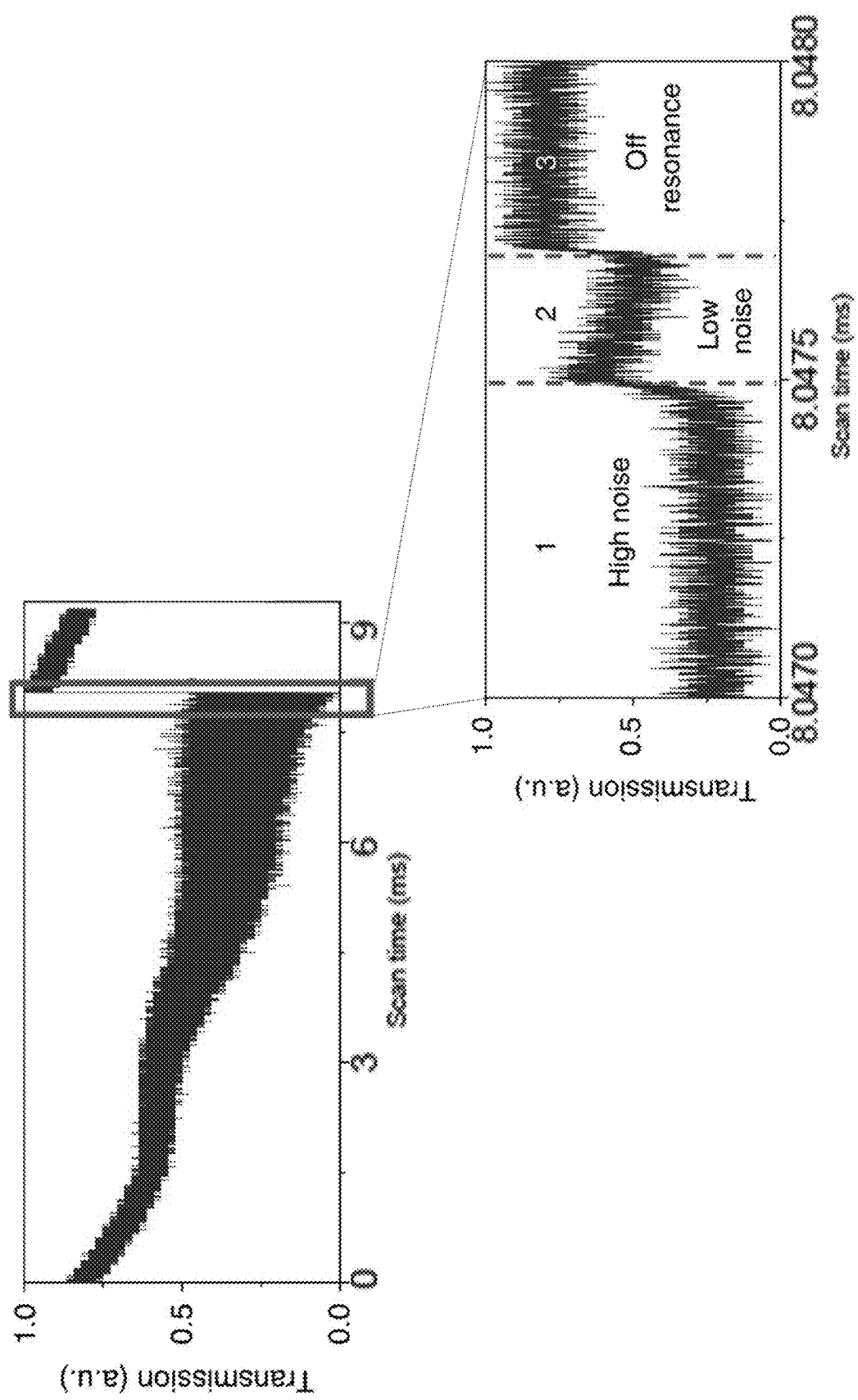
Figure 3A:
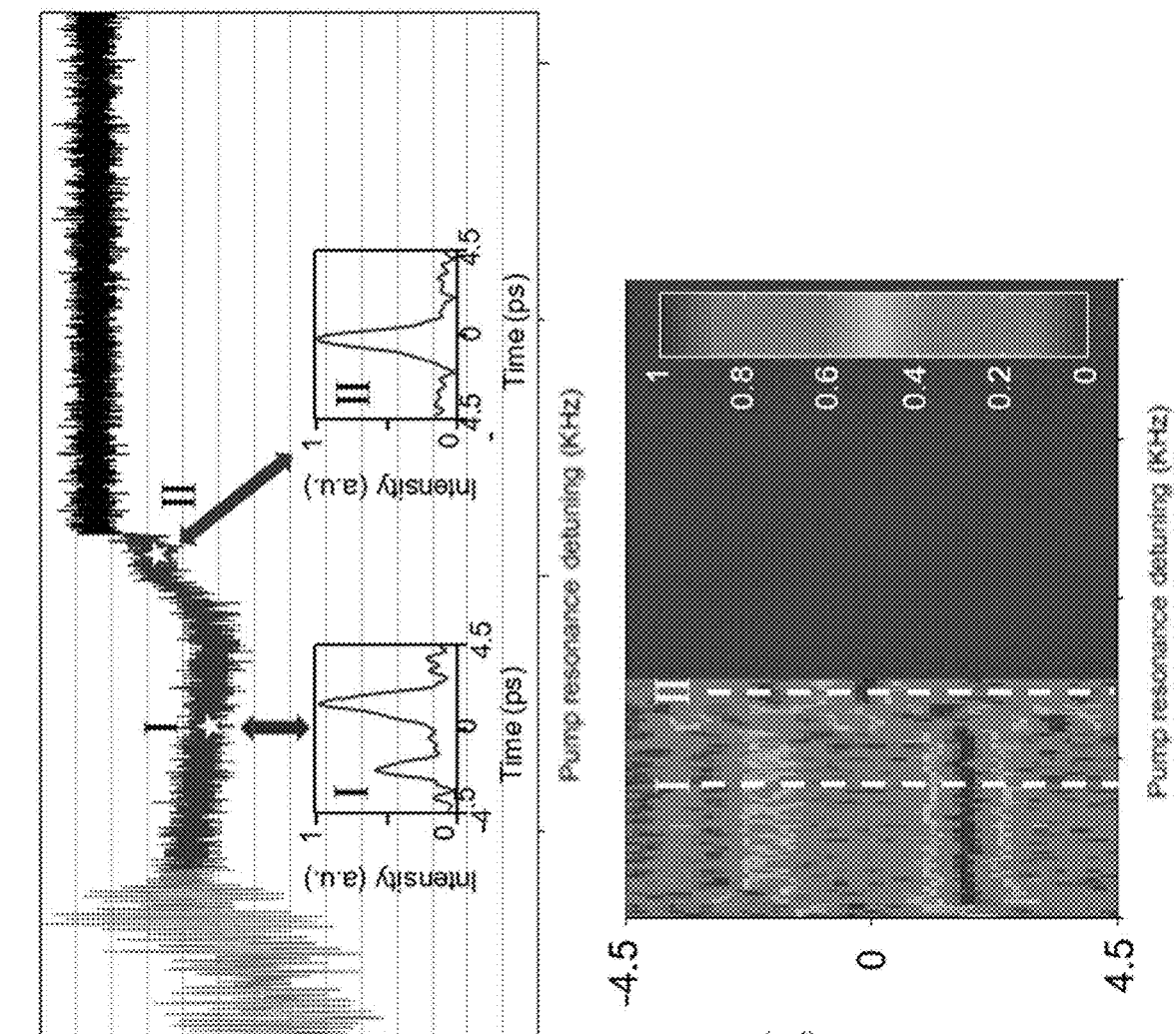
FIGS. 3a to 3c provide UTM-enabled comparison in stability zone and temporal dynamics between static and dispersion-managed dissipative Kerr solitons in accordance with embodiments where: a) shows the total power transmission (left panel) and the 2D evolution portrait (right panel) of static soliton formation in a homogenous microresonator with a measured GVD of −33 fs$^2$/mm (single soliton is only observed at the last transmission step and remains stable for pump-resonance detuning range of 30 kHz where the cavity loading is reduced to 30%, and the on-chip pump power is 30 dBm); b) shows the total power transmission (left panel) and the 2D evolution portrait (right panel) of dispersion-managed soliton formation in the tapered microresonator, showing enlarged stability zones compared to that of static solitons (with the on-chip pump power of 30 dBm, transitions from chaotic oscillation to multiple soliton and eventually to single soliton state are also observed, different from the static soliton formation shown in a) transition from multiple to single soliton state does not require ejection of excessive intracavity power, instead, monotonic increase of the cavity loading from 38% to 52% is measured along the gradual transition into single soliton state; and c) shows the on-chip pump power increased to 32 dBm, single soliton state can persist across the whole transmission step and remain stable for pump-resonance detuning range of 400 kHz while the cavity loading is monotonically increased to 57% (at this pump power level, no stable soliton state is observed in a homogeneous microresonator, insets: measured pulse shapes at the pump-resonance detunings denoted by the white dashed lines in the 2D mappings).

FIG. 2d shows the total transmission of embodiments of the microresonator with respect to the pump-resonance detuning when the pump frequency is scanned across the resonance at a speed of 2.1 THz/s. The transmission deviates from the Lorentzian lineshape but follows a triangular profile defined by the combined effect of thermal and nonlinear resonance shift, resulting in optical bistability that eventually leads to dissipative Kerr soliton formation. At the edge of the resonance, multiple discrete transmission steps are observed which have been identified as important attributes of the dissipative Kerr soliton (FIG. 2d). As solitons are formed, excessive optical power is ejected from the cavity, resulting in stepwise increase of the total transmission. To compare the difference in transition dynamics and stability zone between the static and dispersion-managed dissipative Kerr soliton, it is possible to synchronize both the transmission and UTM measurements with the pump frequency scanning and focus on the dynamics around these transmission steps. A representative result of static soliton formation in a homogenous microresonator according to embodiments is summarized in FIG. 3a.

In some embodiments, the $Si_3N_4$ microresonator is made of a 1.2×0.8 µm² uniform waveguide, with a loaded Q of 1.5×10⁶, a cavity loading of 86%, and a measured GVD of −33.07 fs²/mm (FIG. 1b). At the first transmission step where the cavity loading drops to 45% (corresponding to the transmission of 55%), a doublet soliton state is reached and stays stable for a 160 kHz change in pump-resonance detuning before the second transmission jump. Further reduction of the cavity loading to 30% results in the formation of singlet soliton state, which nevertheless only exists in a small stability region of 30 kHz. An on-chip pump power of 30 dBm is used in this example, but similar behavior is noted for pump power of 24 dBm and 27 dBm. However, no stable soliton states are observed when the on-chip pump power exceeds 30 dBm.

Figure 3B:
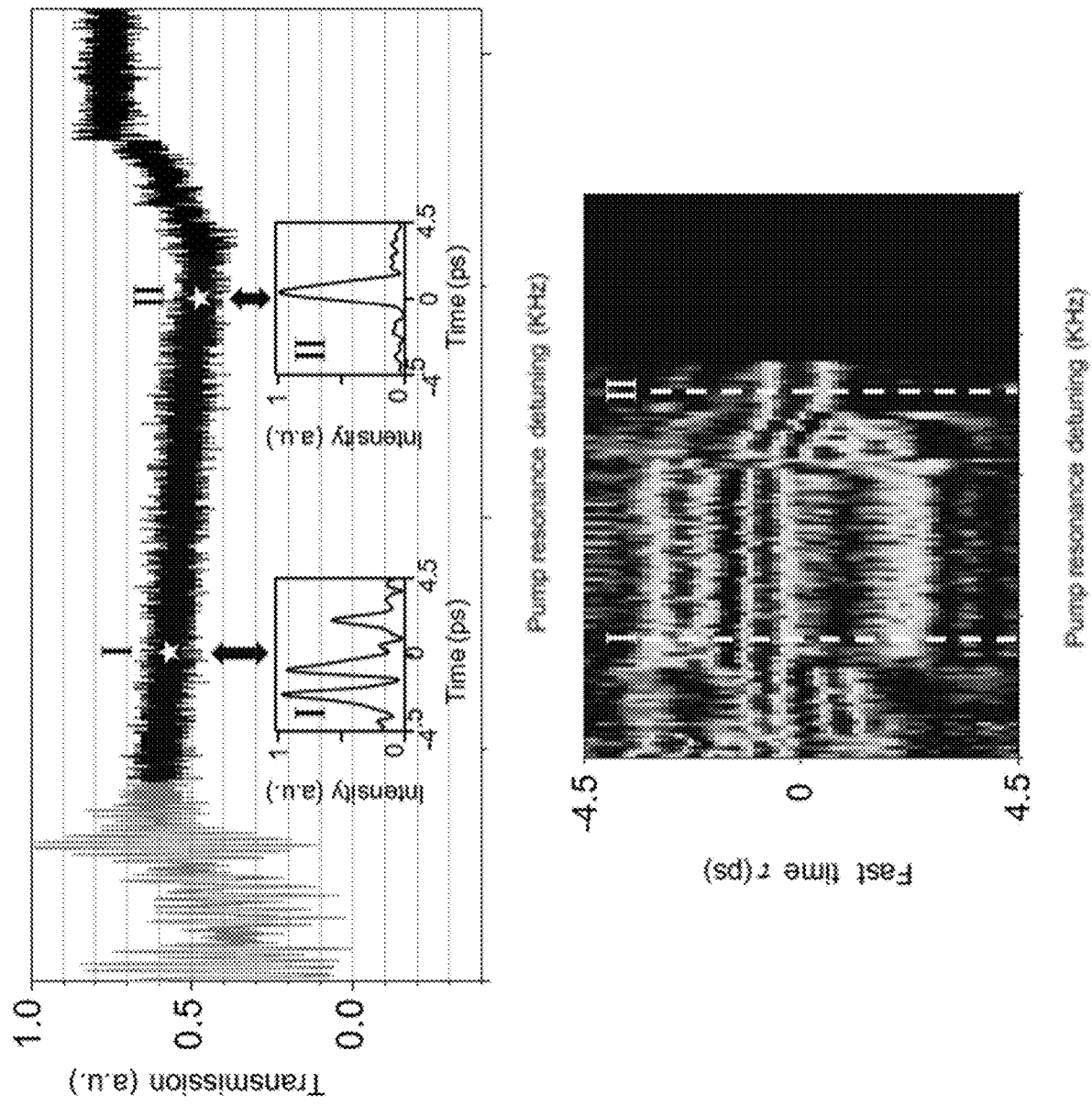
Figure 3C:
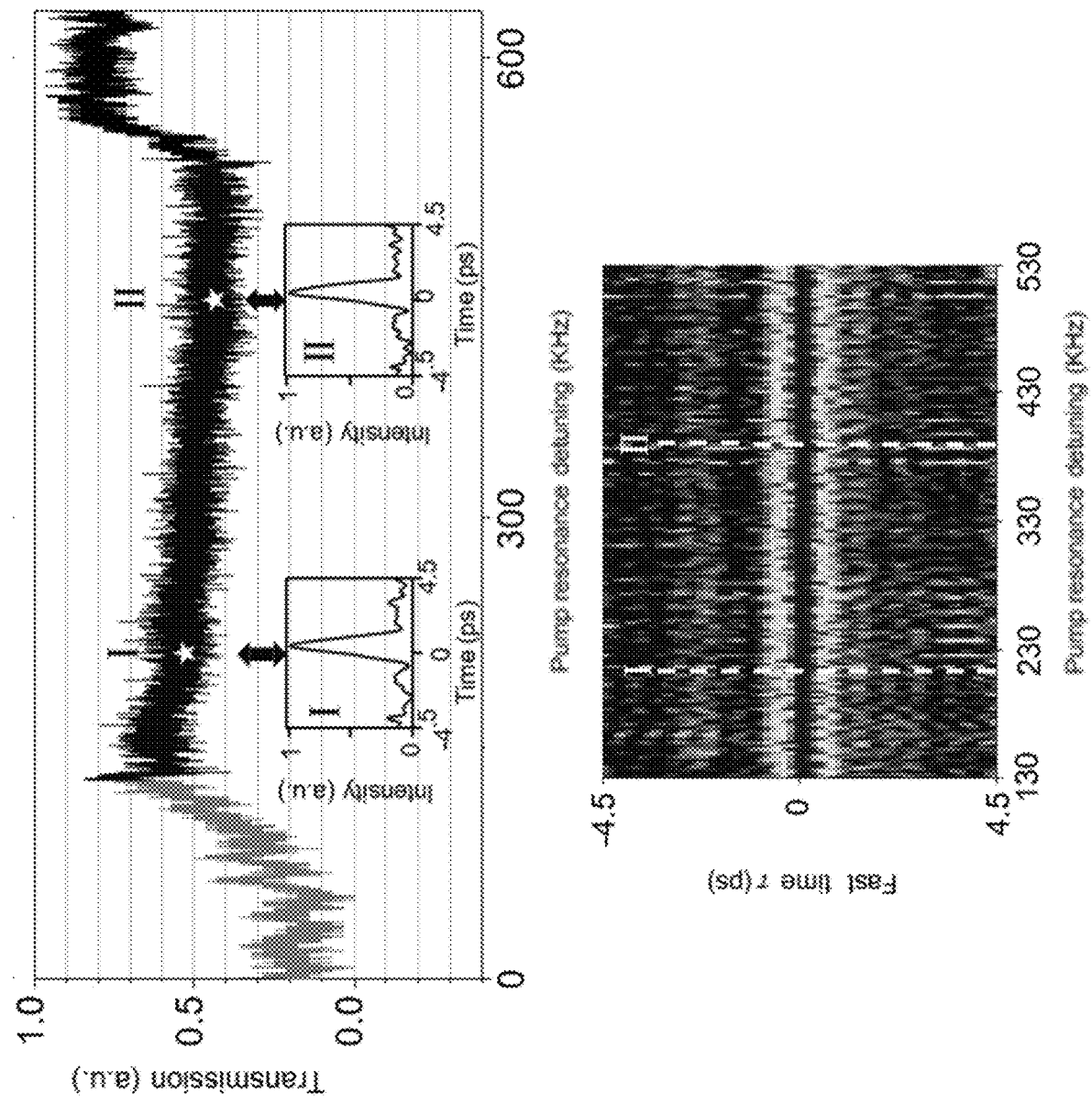

In comparison, representative results of dispersion-managed soliton formation with distinctly different features according to embodiments are summarized in FIGS. 3b and 3c. First, stable singlet soliton is observed at both the power level of 30 dBm (FIG. 3b) and 32 dBm (FIG. 3c), with better success rate in achieving the singlet soliton state at higher power. The on-chip pump power of 32 dBm is limited by the available power of our high power erbium-doped fiber amplifier. Second, while transition from chaos to stable solitons is still associated with a transmission step, the transition from multiple soliton state to singlet soliton state no longer results in further ejection of excessive intracavity power. Rather, monotonic increases of the cavity loading from 38% to 52% (FIG. 3b) and from 36% to 57% (FIG. 3c) are observed. When the on-chip pump power is 30 dBm, the triplet solitons are first observed after the transmission step (FIG. 3b-I) and their interaction gradually results in transition to a singlet soliton state at the end of the transmission step (FIG. 3b-II). Both characteristics illustrate the superiority of embodiments of the dispersion-managed soliton to circumvent the high-energy pulse break-up problem and concentrate more energy into a singlet soliton pulse. Furthermore, the stability zone of dispersion-managed soliton states according to embodiments, including both the multiple and the singlet soliton cases, are extended to 340 kHz (FIG. 3b) and 400 kHz (FIG. 3c), more than doubled compared to the stability zone of the static soliton. In particular at higher on-chip pump power of 32 dBm, the singlet soliton state can persist across the whole transmission step (FIG. 3c), showing a remarkable enlargement of the singlet soliton stability zone by more than an order of magnitude (400 kHz as opposed to 30 kHz).

Figure 4A:
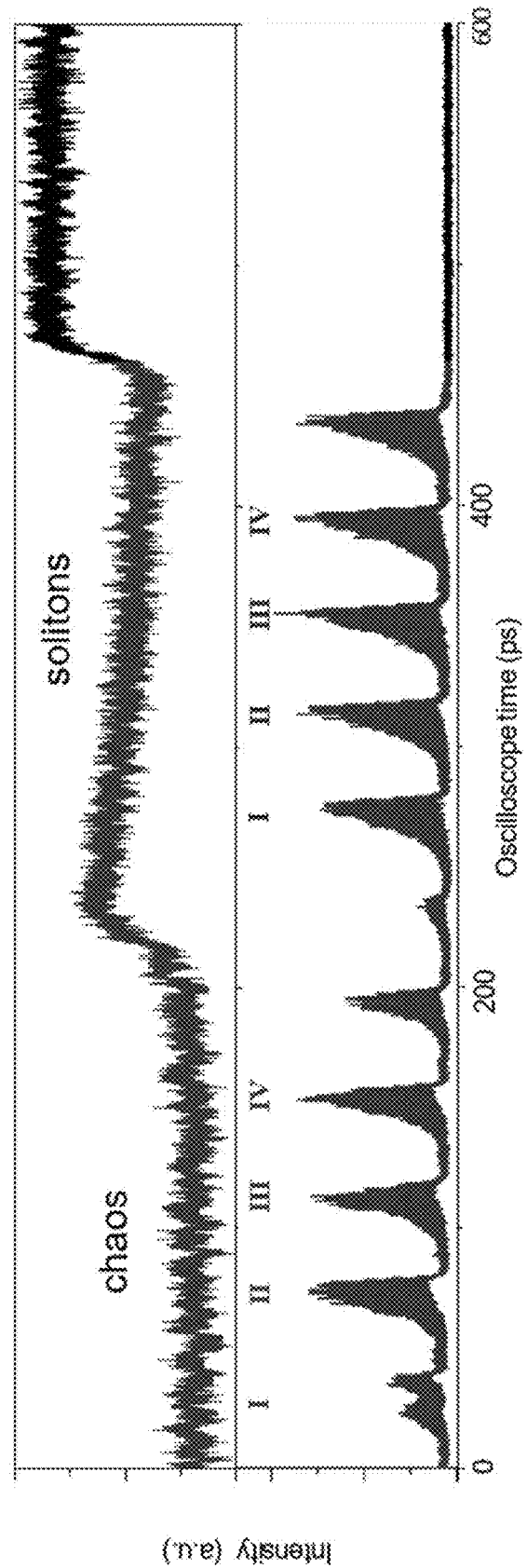
FIGS. 4a to 4d provide data plots of transition dynamics of dispersion-managed dissipative Kerr solitons in accordance with embodiments where: a) shows the total power transmission (top panel) and magnified optical waveforms on the real-time oscilloscope (bottom panel) (for the case where the singlet soliton state persists across the whole transmission step); b) shows the temporal pulse structure is still discernible before the transition despite intense and rapid soliton interaction dynamics; c) shows the real time is equal to oscilloscope time/M$_{UTM}$; and d) shows a comparison, temporal structure before the transition has a higher degree of randomness for the case where transition from multiple to the singlet soliton state occurs in the transmission step.
Figure 4B:
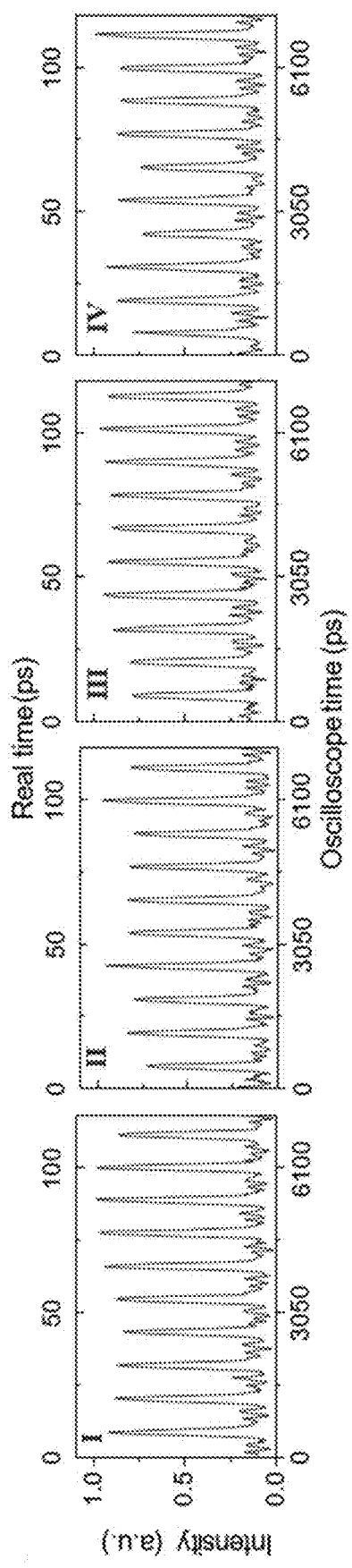
Figure 4C:
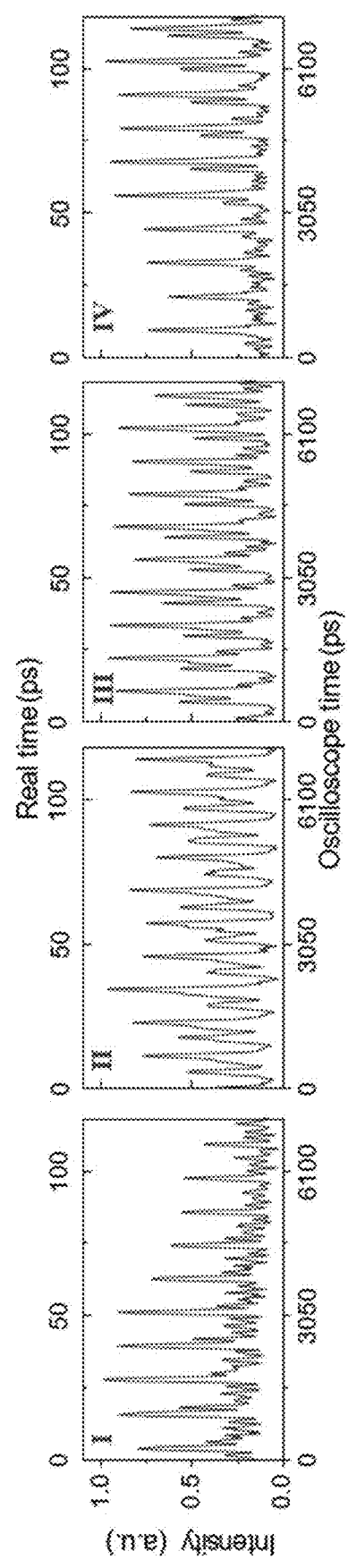
Figure 4D:
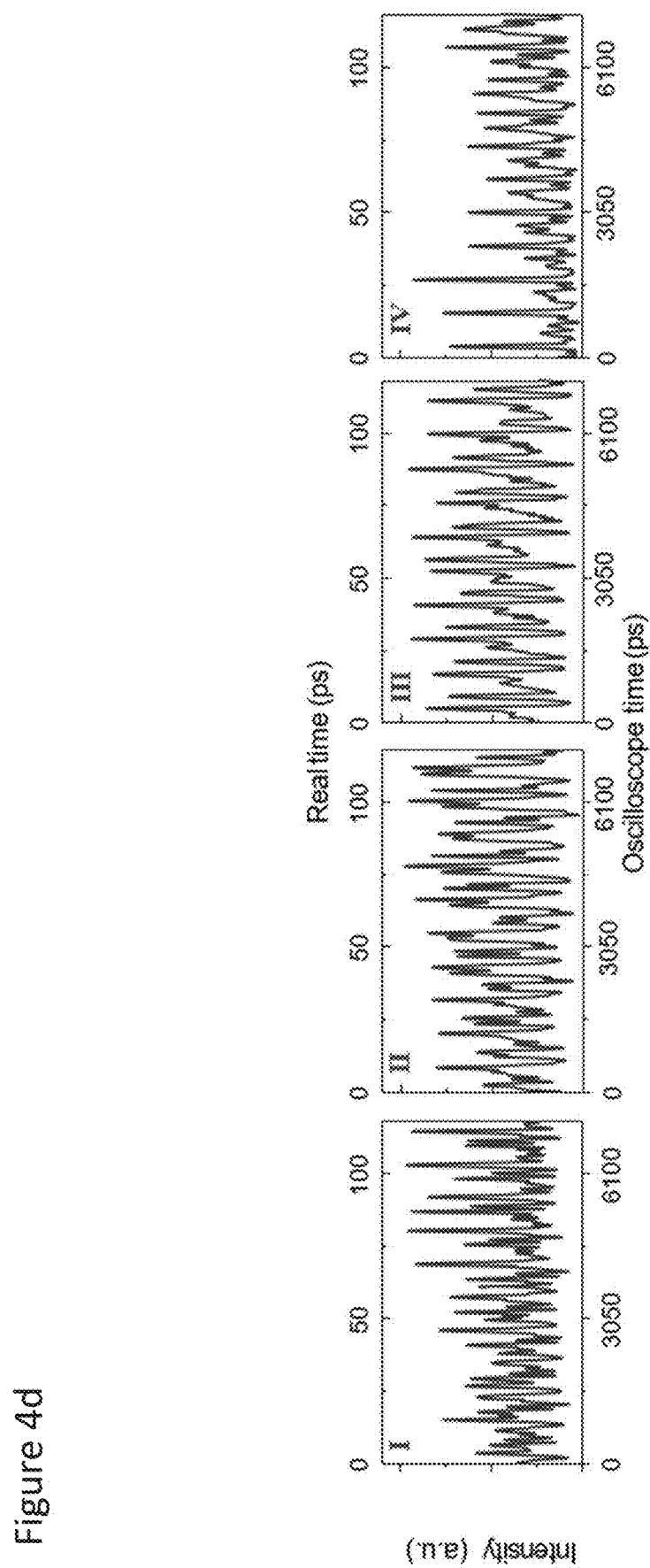
Figure 5:
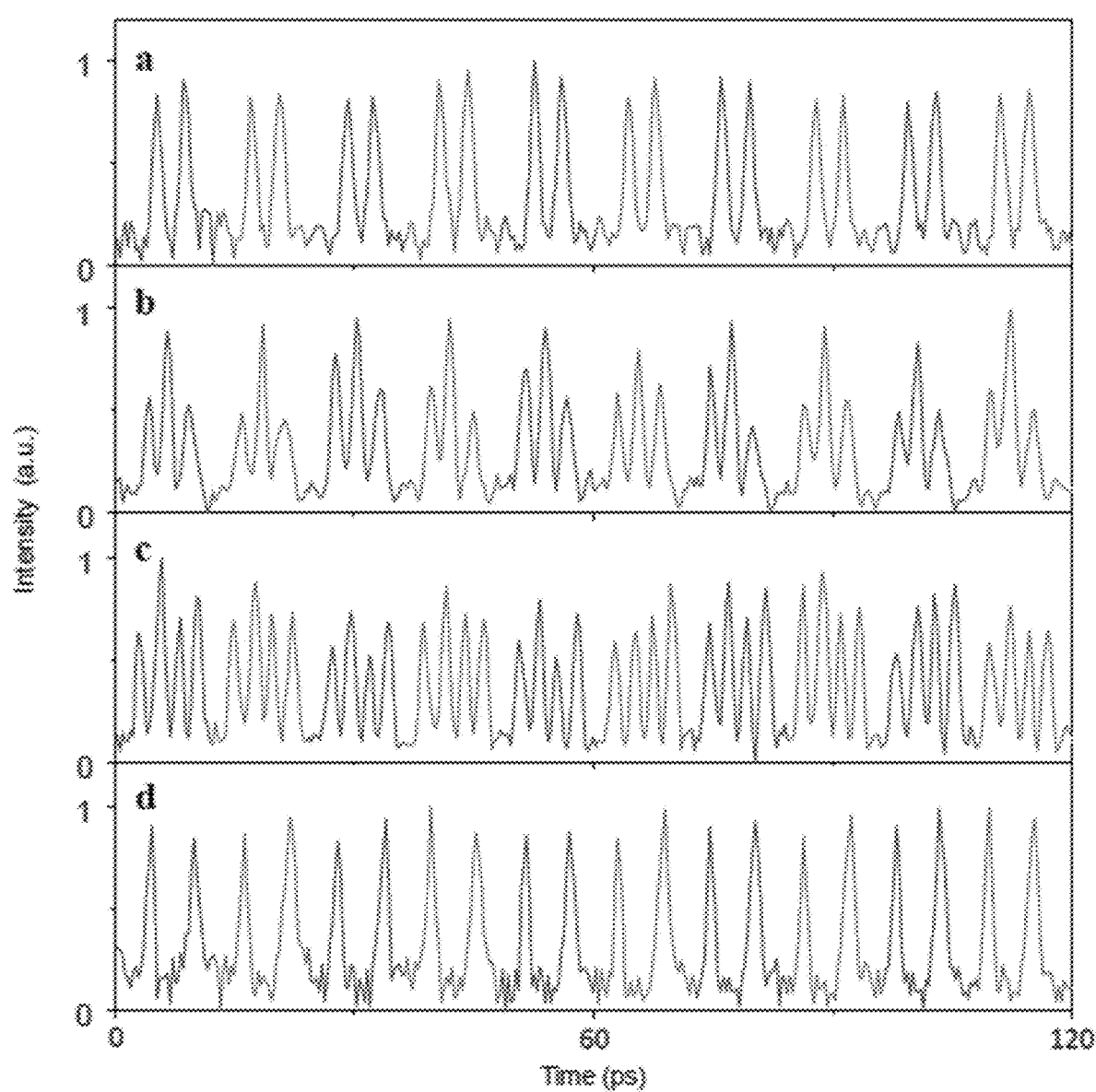
FIGS. 5a to 5d provide data plots of dissipative Kerr soliton molecules in accordance with embodiments where: a) shows that the doublet state is observed with a pump power of 32 dBm; b) with a pump power of 30 dBm, triplet state consisted of 3 closely packed pulses is noted; c) a quadruplet state is also found with a pump power of 30 dBm; and d) a soliton crystal made of equidistant soliton doublet is observed with a pump power of 32 dBm (the alternating blue-red colors denote the consecutive cavity roundtrips).

Generation of this particularly stable singlet soliton state is found to be correlated with a cleaner transmission curve before the transition (gray region in FIG. 3), with the root mean squared fluctuation dropping from 20% to 10%. To probe the real-time dynamics in this potentially chaotic oscillation regime, the UTM is slightly modified to increase the signal-to-noise-ratio and reduce the TOD-induced aberration, at a cost of lowering the measurement frame rate (red dashed box in FIG. 2c). While the overall system GVD is increased by more than a factor of 5, the TOD is minimized by a proper combination of dispersion compensating fiber and non-zero dispersion shifted fiber. Output from the stabilized femtosecond mode-locked fiber laser comb, for optically sampling along the slow time axis, is pulse-picked with an electro-optic modulator (EOM) to cut the repetition rate down to 25 MHz. The arbitrary waveform generator (AWG), electronically synchronized to the mode-locked pulse train, serves effectively as a high quality frequency divider and drives the EOM for pulse picking with a dynamic extinction ratio of more than 20 dB. With the modified UTM, it is possible to measure the evolution of not only the stable solitons but also the chaotic oscillations before the stable transition (FIG. 4). In the case where singlet soliton remains stable across the whole transmission step (FIG. 3c), the temporal structure before the transition appears to be less chaotic, resulting in a cleaner transmission curve. In spite of intense and rapid soliton interaction dynamics (FIG. 4c), clear temporal pulse structure is observed and the degree of randomness is much smaller compared to the chaotic oscillation in other cases (FIG. 4d). Finally, FIG. 5 shows other soliton molecule states observed in embodiments of the adiabatically tapered microring. Different from the higher order soliton obtained in a conserved system, dissipative soliton molecules are robust and stationary multi-pulse temporal structures that result from the interaction between collections of initially independent solitons, resembling the binding dynamics. Closely packed soliton molecules with doublet, triplet, and quadruplet structures are shown in FIGS. 5a-c respectively. On the other hand, FIG. 5d depicts a soliton crystal where the doublet soliton pair is self-organized in an equidistant order.

In summary, embodiments demonstrate dispersion-managed dissipative Kerr solitons in an adiabatically tapered $Si_3N_4$ microring resonator. The oscillating GVD along the cavity renders itself in a Gaussian-like optical spectrum, which has a more equalized close-to-pump comb power than a $sech^2$ spectral shape. In other embodiments, UTM technology may be used to portray the soliton molecules and study the evolution dynamics of these dispersion-managed dissipative Kerr solitons. In accordance with embodiments, it is possible to demonstrate that dispersion-managed dissipative Kerr solitons can sustain more pulse energy than their static counterparts in traditional homogeneous microresonators. There is also a remarkable enlargement of the singlet soliton stability zone by more than an order of magnitude. Furthermore, the stretched-pulse operation with close-to-zero net cavity GVD promises to be beneficial for reducing timing jitter of Kerr frequency comb and advancing on-chip microwave photonics in the future.

Exemplary Embodiments

Experiments were conducted to demonstrate the capabilities of the dispersion-managed dissipative Kerr solitons in accordance with embodiments. These results and discussion are not meant to be limiting, but merely to provide examples of operative devices and their features.

Methods and Materials

Device fabrication: The microresonator was fabricated with CMOS-compatible processes: first, a 5 µm thick under-cladding oxide was deposited via plasma-enhanced chemical vapor deposition to suppress the substrate loss. An 800 nm thick $Si_3N_4$ layer was then deposited via low-pressure chemical vapor deposition, patterned by optimized deep-ultraviolet lithography, and etched via optimized reactive ion dry etching. Sidewall angle of 88° was determined using transmission electron microscope. Annealing at a temperature of 1150° C. was then applied to the chip for 3 hours to reduce the waveguide propagation loss. Finally the dispersion-managed microresonator was over-cladded with a 3 µm thick oxide layer, deposited initially with LPCVD (500 nm) and then with PECVD (2500 nm). Adiabatic mode converters were implemented on the side of the chip to improve the coupling efficiency from the free space to the bus waveguide, to less than 3 dB coupling loss per facet.

Ultrafast temporal magnifier for 2D mapping of the dissipative Kerr soliton dynamics: Our time-lens was implemented though four-wave mixing (FWM) in a 50-m highly-nonlinear fiber (HNLF). The FWM pump was derived from a stabilized femtosecond mode-locked fiber laser, with its spectral component from 1554 nm to 1563 nm first filtered out by a wavelength-division multiplexing (WDM2) and subsequently amplified by a C-band erbium-doped fiber amplifier (EDFA-C) to 50 mW. Before the signal and the pump were combined via a WDM3 into the FWM stage, they were chirped by $D_1$ and $D_f$ respectively through two spools of SMF-28. The generated idler was filtered out via WDM4 and then chirped by the output dispersion D2 through a spool of DCF. Finally, the filtered and chirped idler was amplified by an L-band erbium-doped Characterizations and measurements during the device fabrication.

Figure 6:
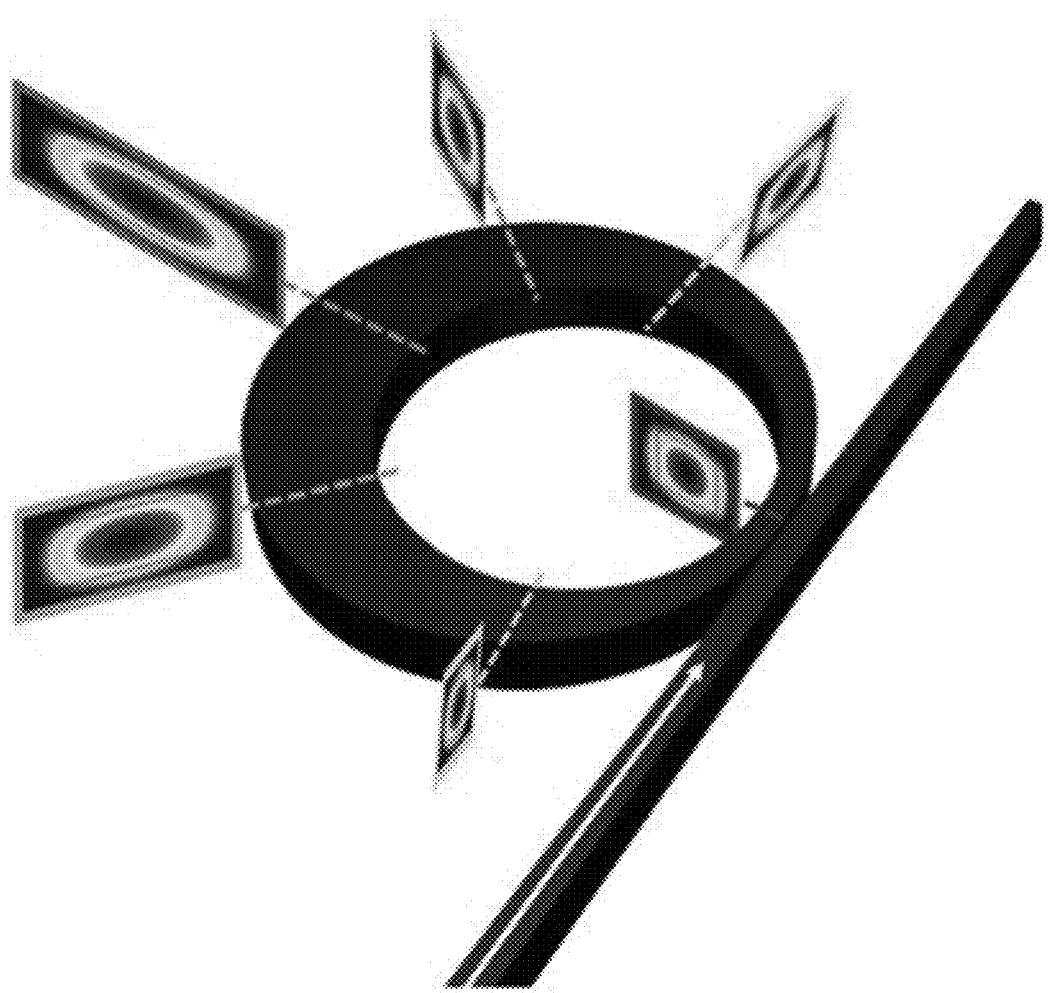
FIG. 6 provides transverse distributions of the TE00 mode fields along the tapered microring in accordance with embodiments, where waveguide widths of 1 μm, 2 μm, 3 μm, and 4 μm, respectively, are shown.

Measurement of dispersion: FIG. 6 shows the COMSOL modeled field distributions of the fundamental $TE_{00}$ modes along the adiabatically tapered microring. Modeling is performed on 50 nm triangular spatial grid with perfectly-matched layer absorbing boundaries and 5 µm spectral resolution. The microring has a diameter of 500 µm and tapered widths from 1 µm to 4 µm to produce variation in effective mode index, neff, and dispersion management along the cavity. Since the microring diameter is sufficiently large, the bending loss and the bending dispersion of the resonator waveguide are negligible in our microring resonators. Using the 4th order accurate central finite difference method, we numerically evaluate GVD and TOD (FIG. 7) in accordance with formulas:

$$GVD = \frac{\lambda^3}{2\pi c_0^2} \frac{d^2}{d\lambda^2} n_{eff} \quad \text{and} \quad \text{(EQ. 2)}$$

$$TOD = -\frac{\lambda^4}{4\pi^2 c_0^3} \left( \lambda \frac{d^3}{d\lambda^3} n_{eff} + 3 \frac{d^3}{d\lambda^3} n_{eff} \right) \quad \text{(EQ. 3)}$$

Figure 7A:
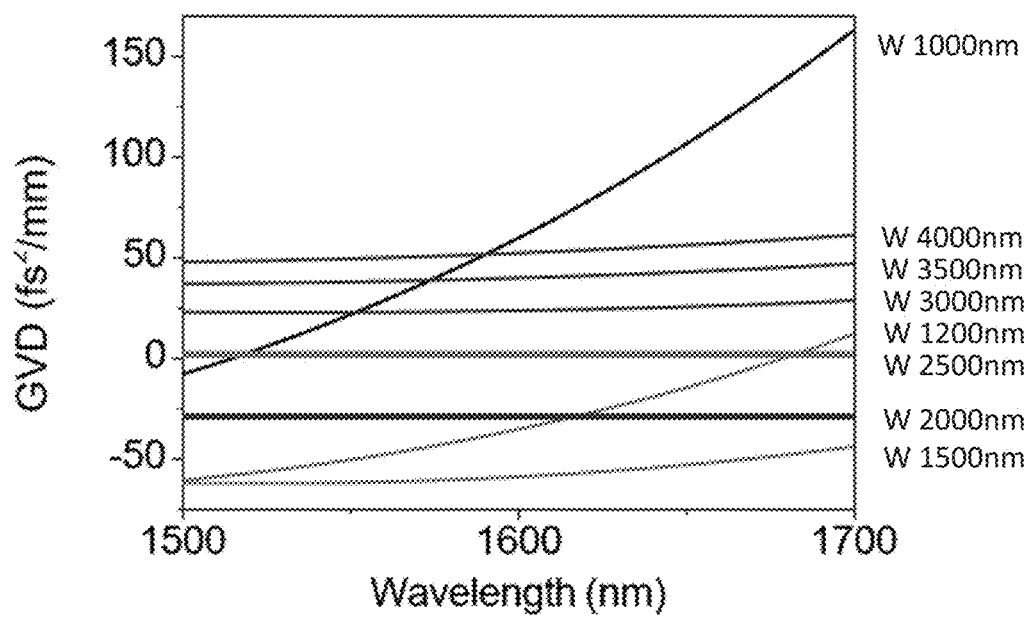
FIGS. 7a to 7d provide simulated GVD and TOD data for the tapered microring for the fundamental mode TE00 in accordance with embodiments, where: a) and c) provide the dispersions for different waveguide widths; and b) and d) provide the dispersions at pump wavelength (1598.5 nm) along the microresonator.
Figure 7B:
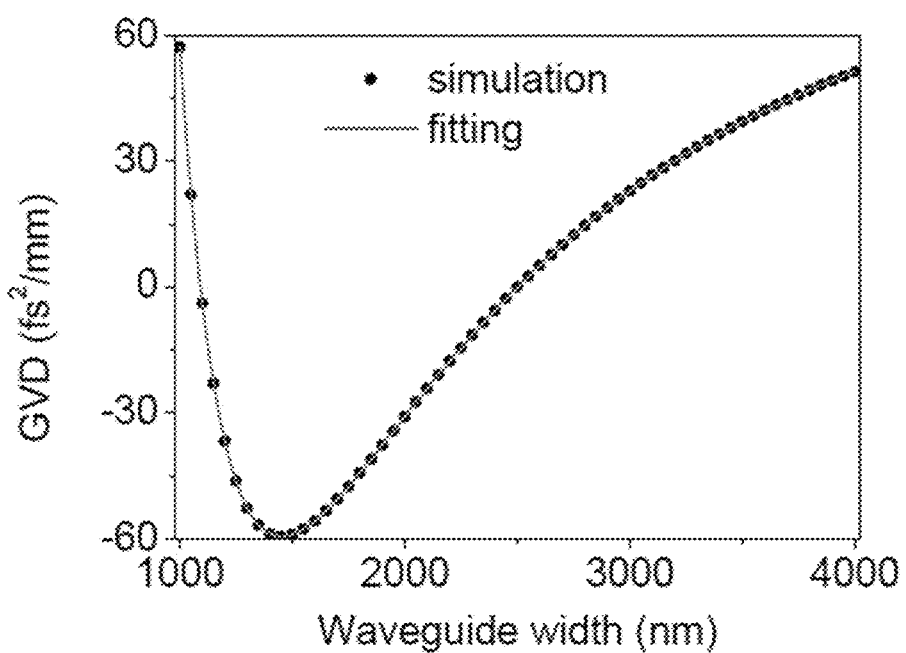
Figure 7C:
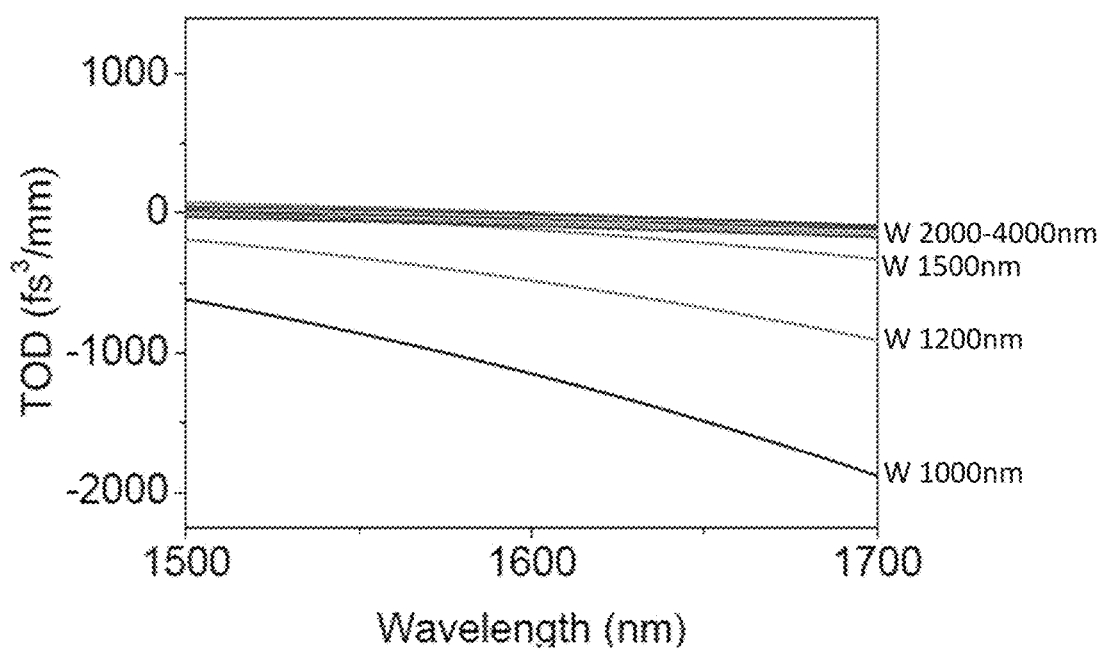
Figure 7D:
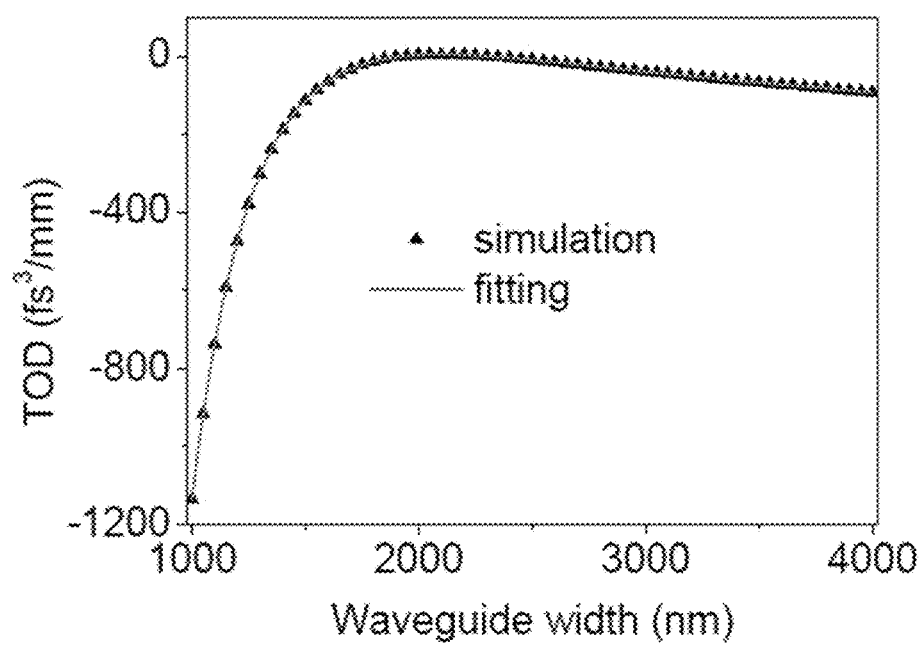

For the pump wavelength (1598.5 nm), the GVD of the fundamental mode (TE00) of the microresonator proceeds from normal to anomalous, then back to normal when the waveguide width adiabatically increases from 1 µm to 4 µm, as shown in FIG. 7b. When light propagates through the tapered microring, the path-average dispersion, Dave, is an arithmetic mean of dispersions in each segment:

$$D_{ave} = \frac{1}{C} \int_{resonator} D(\lambda, s) ds \quad (EQ. 4)$$

where C is the total length (i.e. circumference) of the microresonator; D(λ,s) is the dispersion at wavelength λ, and segment at position s. The increment ds is set as 400 nm. Continuous function of dispersions with respect to waveguide width is obtained using a cubic spline interpolation of the COMSOL modeled discrete data points (FIGS. 7b and 7d). The fitted functions are then used to calculate the path-averaged dispersions based on equation (S1). The path-averaged GVD and TOD of the tapered microring at pump wavelength are −2.6 fs²/mm and −397 fs³/mm respectively.

Figure 8:
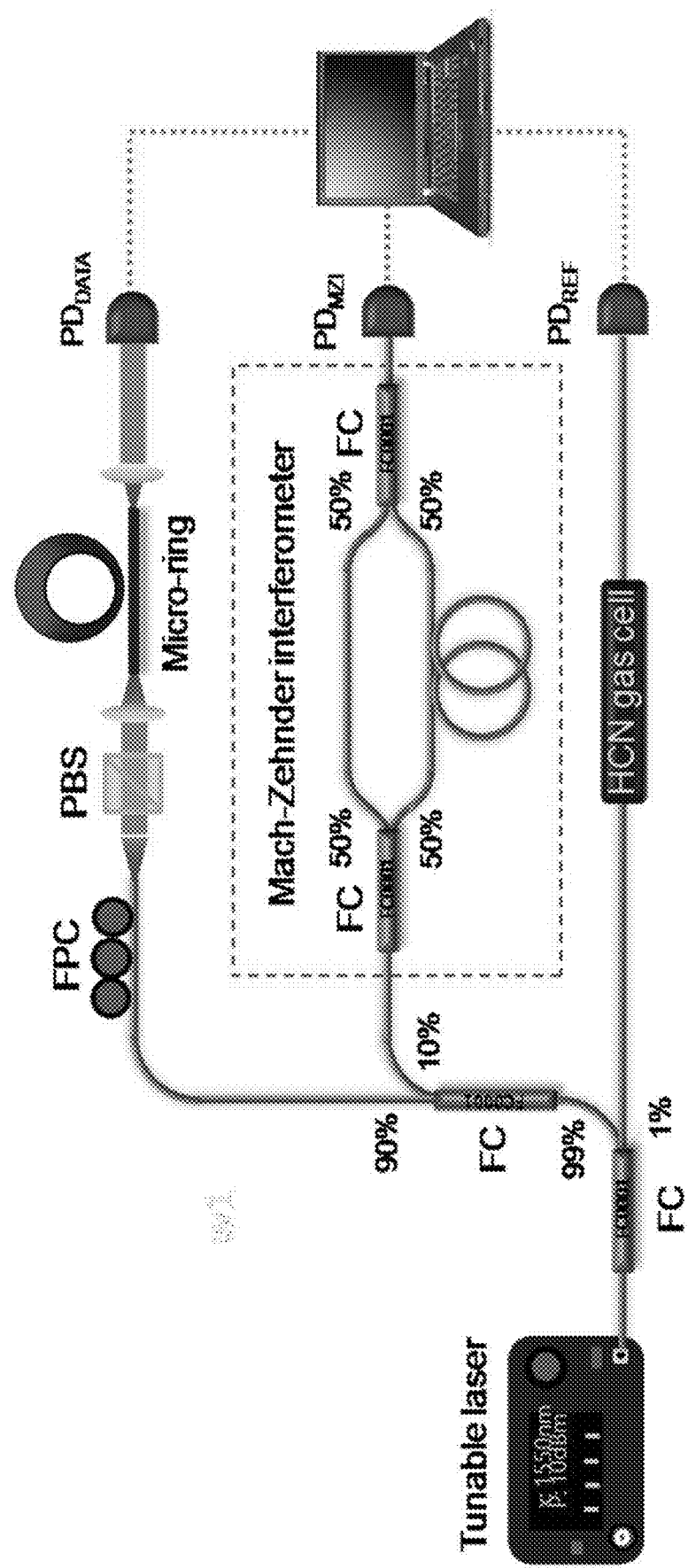
FIG. 8 provides a dispersion measurement setup in accordance with embodiments where, FC: fiber coupler; FPC: fiber polarization controller; PBS: polarization beam splitter; and PD: photodetector.

FIG. 8 shows the schematic diagram of the dispersion measurement setup. The microresonator transmission, from which Q factor and FSR values are determined (FIG. 1b), is measured using a tunable laser swept through its full wavelength tuning range at a tuning rate of 60 nm/s. For absolute wavelength calibration, 1% of the laser output was directed into a fiber coupled hydrogen cyanide gas cell and then into a photodetector (PDREF). The microresonator and gas cell transmissions are recorded simultaneously during the laser sweep by a data acquisition system whose sample clock is derived from a high speed photodetector (PDMZI) monitoring the laser transmission through an unbalanced fiber Mach-Zehnder Interferometer (MZI). The MZI has a path length difference of approximately 40 m, making the measurement optical frequency sampling resolution 5 MHz.

The absolute wavelength of each sweep is determined by fitting 51 absorption features present in the gas cell transmission to determine their subsample position, assigning them known traceable wavelengths and calculating a linear fit in order to determine the full sweep wavelength information. Each resonance is fitted with a Lorentzian lineshape and the dispersion of the microring resonator is then determined by analyzing the wavelength dependence of the FSR.

Figure 9A:
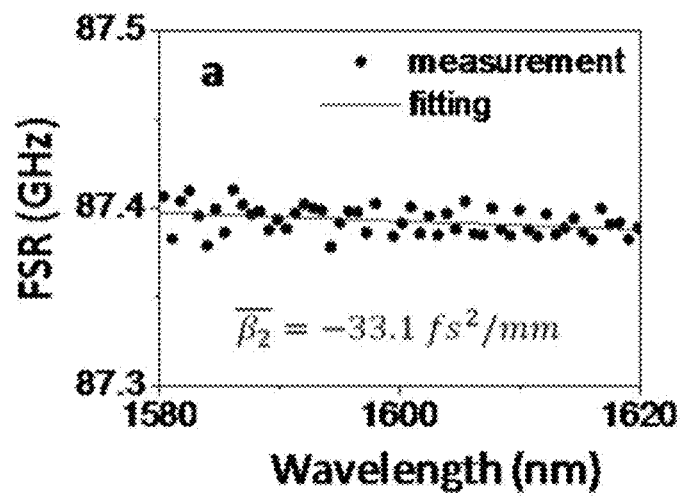
FIGS. 9a to 9c provide measured dispersions of homogeneous microresonators in accordance with embodiments, where: a) is for a microring made of uniform 1.2 μm wide waveguide, the measured non-equidistance of the modes is 250±6 kHz; b) is for a microring made of uniform 1.5 μm wide waveguide, the measured non-equidistance of the modes is 762±6 kHz; and c) is for a microring made of uniform 1.6 μm wide waveguide, the measured non-equidistance of the modes is 765±7 kHz.
Figure 9B:
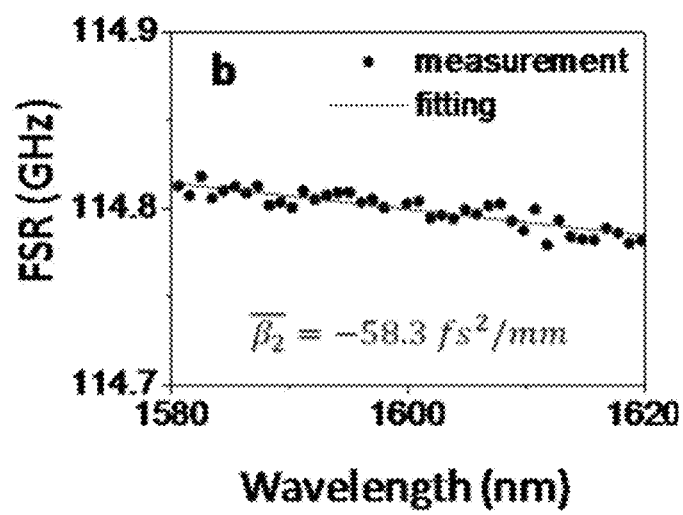
Figure 9C:
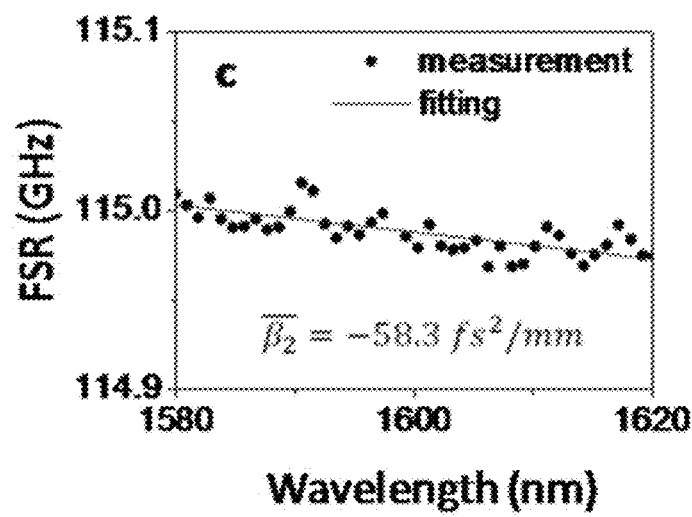

FIG. 9 shows the measured wavelength dependence of the FSR for three homogenous microresonators with uniform waveguide widths of 1.2 µm, 1.5 µm, and 1.6 µm. The mean GVD values, extracted from non-equidistance of the modes and calculated from 10 independent measurements, are −33.1 fs²/mm, −58.3 fs²/mm, and −58.3 fs²/mm respectively. Measurements of the dispersion are in good agreement with the simulations.

Characterization of the two ultrafast temporal magnifiers: The UTM is based on the mathematical analogy between the diffraction of an electromagnetic beam and dispersive propagation of an electromagnetic pulse. The total group delay dispersion (GDD), defined as the product of the GVD and the length of the dispersive medium, is analogous to the propagation distance which determines how much a beam is diffracted. An optical lens imparts a spatial quadratic spatial phase that is proportional to k/f, where the focal length f is a measure of the diffraction required for removal of the phase imparted by the lens. Similarly, one can create a time lens by imparting a quadratic temporal phase (linear frequency chirp dω/dτ) to a waveform. A temporal focal GDD, Df, is defined as the GDD required for removal of the quadratic phase imparted by the time lens. An UTM system is created by cascading an input GDD (D1), a time lens, and an output GDD (D2) in proper measure to satisfy the temporal imaging condition:

$$\frac{1}{D_1} + \frac{1}{D_2} = \frac{1}{D_f} \quad (EQ. 5)$$

A waveform of arbitrary shape passing through this system emerges temporally rescaled with magnification:

$$M_{UTM} = -\frac{D_2}{D_1} \quad (EQ. 6)$$

Figure 10A:
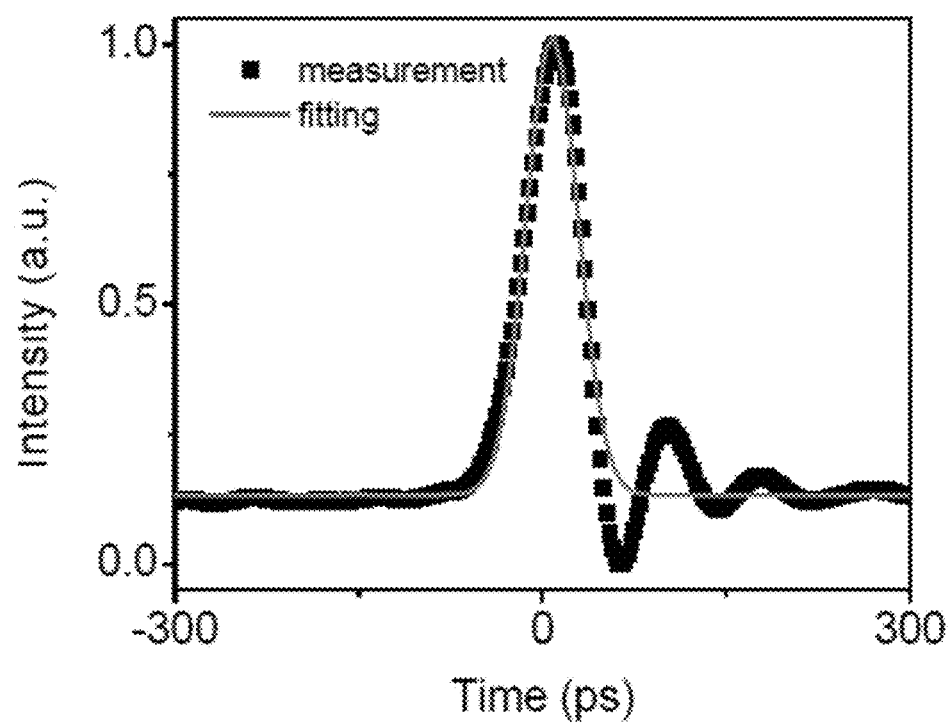
FIGS. 10a to 10d provide the characterization of the UTM using a 450 fs input pulse, where: a) shows the magnified output pulse shape, measuring a FWHM width of 54 ps (after demagnification and deconvolution, it corresponds to a temporal resolution of 600 fs); b) shows the optical spectra of the signal, pump, and idler after the HNLF; c) shows the output timing (dark) and responsivity (light) as a function of delay between the pump and the signal, measuring a magnification factor of 72 and a FWHM temporal field-of-view of 30 ps for the first UTM; and d) shows the output timing (dark) and responsivity (light) as a function of delay between the pump and the signal, measuring a magnification factor of 61 and a FWHM temporal field-of-view of 190 ps for the second UTM with increased SNR and reduced aberration.
Figure 10B:
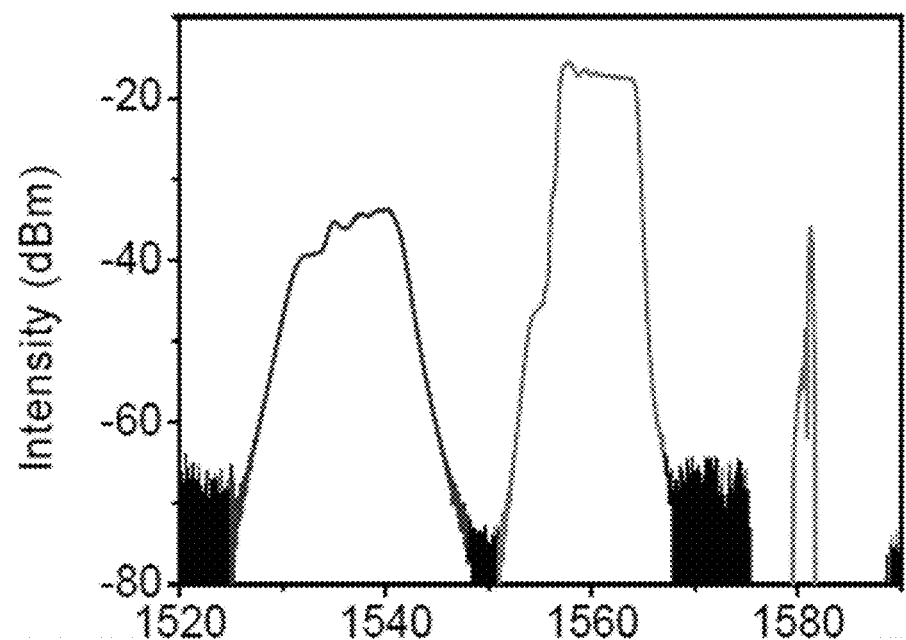
Figure 10C:
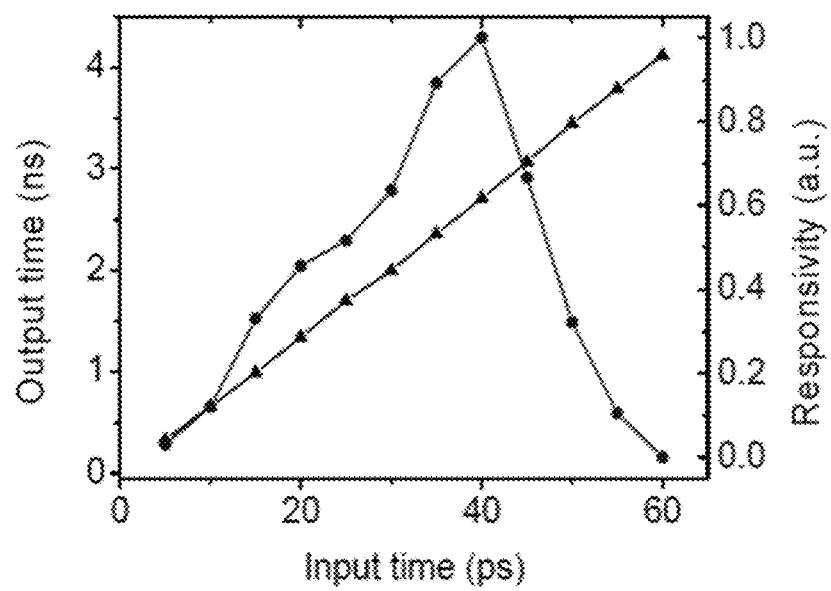
Figure 10D:
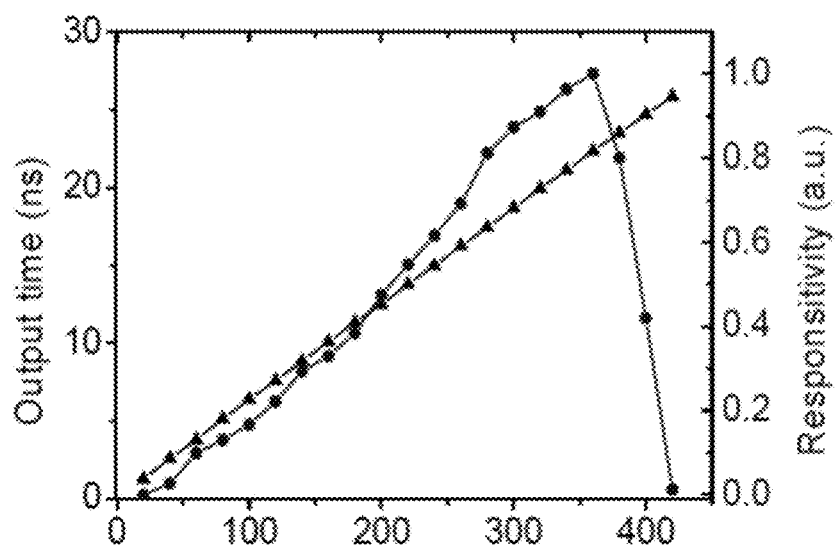

To characterize the performance of the UTM system, a transform-limited femtosecond pulse with a bandwidth of 8 nm and a center wavelength of 1543 nm was used as the test input. The pulsewidth of the test input was independently measured to be 450 fs by a second-harmonic generation autocorrelation setup. The UTM output waveform and optical spectrum are shown in FIGS. 10a and 10b. We determined the magnification factor and the FWHM temporal field-of-view by measuring the output timing and responsitivity as functions of the delay between the signal and the pump (FIGS. 10c and 10d). For the first UTM, the measured magnification factor and FWHM temporal field-of-view are 72 and 30 ps. The magnified output pulsewidth is 54 ps, corresponding to a temporal resolution of 600 fs after demagnification and deconvolution using the formula:

$$= \tau = \sqrt{\left(\frac{\tau_T}{M_{UTM}}\right)^2 - \tau_i^2} \quad (EQ. 7)$$

where $\tau_T$ and $\tau_i$ are the widths of the output and input pulses respectively.

UTM was later slightly modified to increase the SNR and reduce the TOD-induced aberration, at a cost of lowering the measurement frame rate from 250 MHz to 25 MHz. (Table 1, below, provides the parameters of UTM.) For this second UTM, the measured magnification factor and FWHM temporal field-of-view are 61 and 190 ps. Both the input dispersion D1 and the pump dispersion Df were replaced by spools of specialty linear chirped fibers made with combining DCF and LEAF. Since the LEAF has opposite dispersion slope compared to the DCF, linear dispersion without TOD can be achieved by properly combining the two types of fiber with a ratio of 7.4.

TABLE 1

| Parameters of the UTM Components | | |
|---|---|---|
| Device | 1st UTM | 2nd UTM |
| WDM1 | 1538-1547 nm | 1538-1547 nm |
| D₁ | −5.2 ps/nm | −27.45 ps/nm |
| WDM2 | 1554-1563 nm | 1554-1563 nm |
| D_f | −9.5 ps/nm | −55.8 ps/nm |
| HNLF | HNL-DSF 50 m | HNL-DSF 60 m |
| D₂ | 372 ps/nm | 1.7 ns/nm |
| WDM4 | 1569-1610 nm | 1569-1610 nm |

Figure 11A:
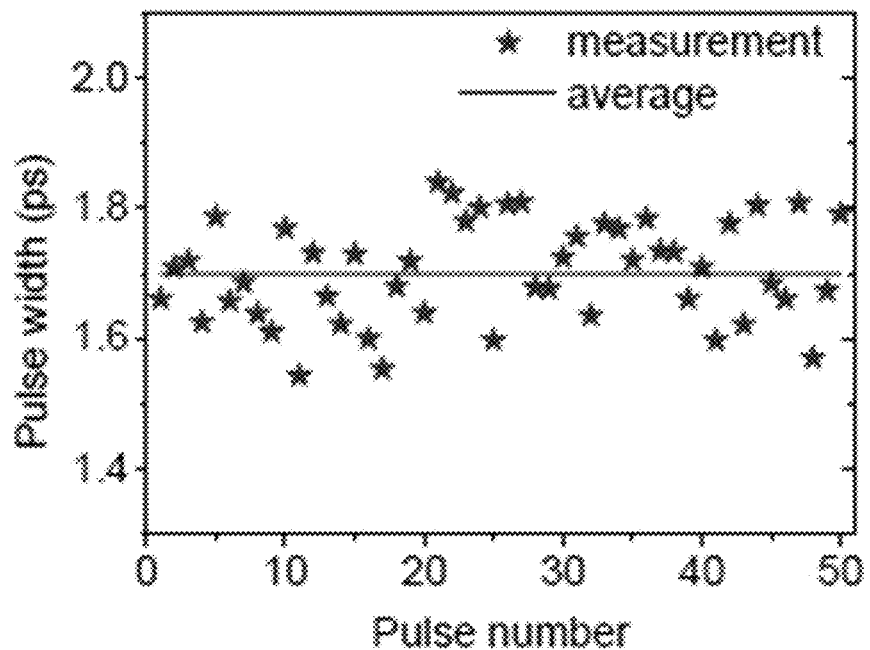
FIGS. 11a and 11b provide the: a) pulsewidths and b) repetition periods of 50 pulses from the dispersion-managed microresonator (where the black line is the average value).
Figure 11B:
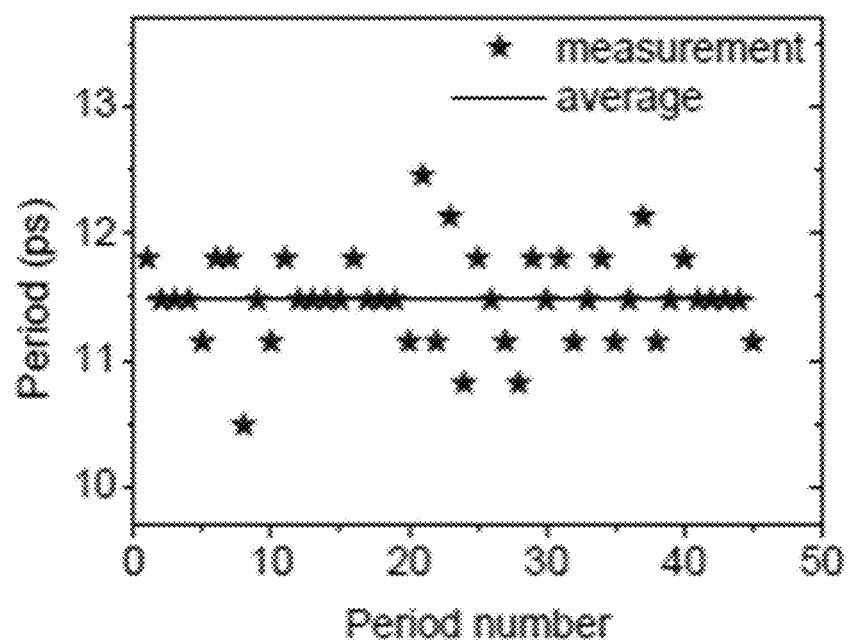
Figure 12A:
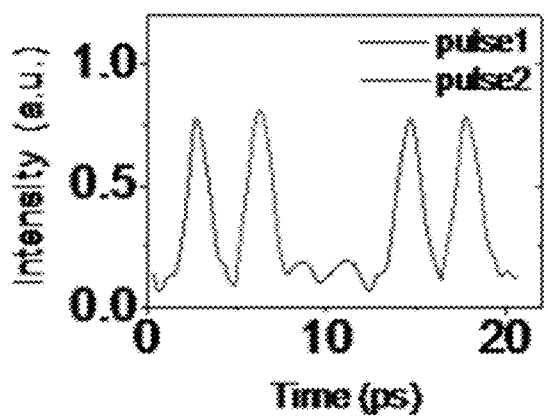
FIGS. 12a to 12d provide dissipative Kerr soliton molecules in the adiabatically tapered Si$_3$N$_4$ microring, where: a to d) provide the measured temporal structures of the soliton molecules including the doublet soliton state, the soliton crystal state, the triplet soliton state, and the quadruplet soliton state (above); and also provide corresponding intracavity waveforms of the corresponding dissipative Kerr soliton molecules (below).
Figure 12A:
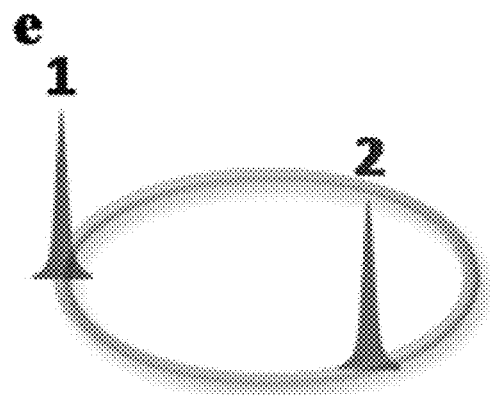
Figure 12B:
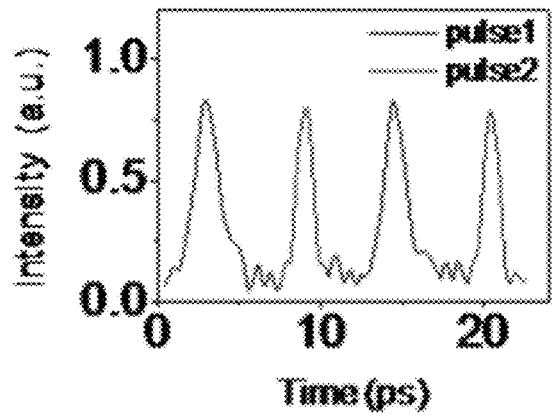
Figure 12B:
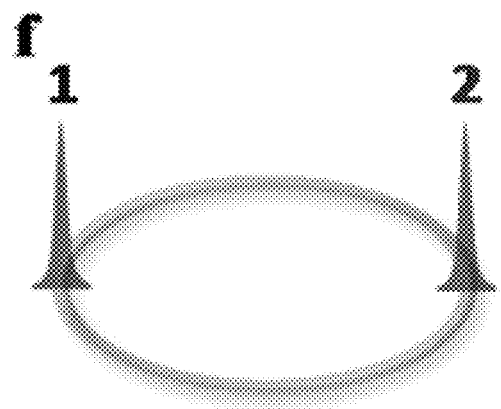
Figure 12C:
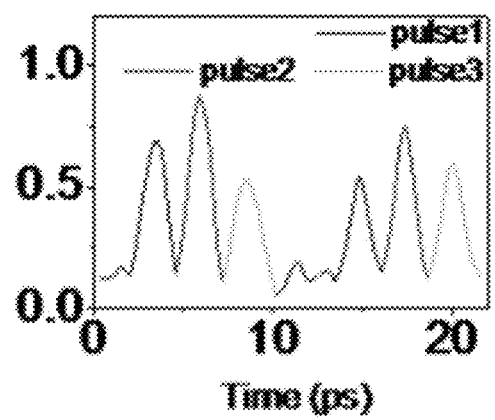
Figure 12C:
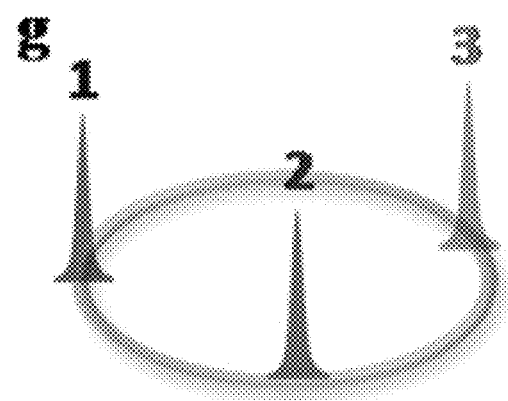
Figure 12D:
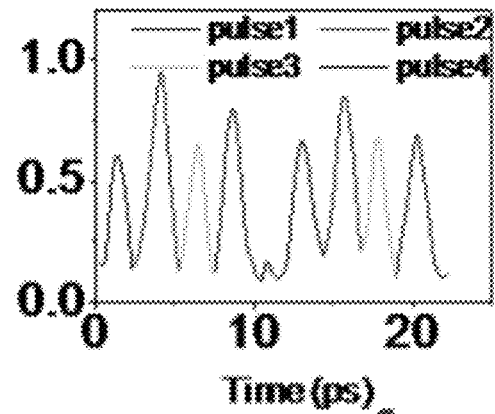
Figure 12D:
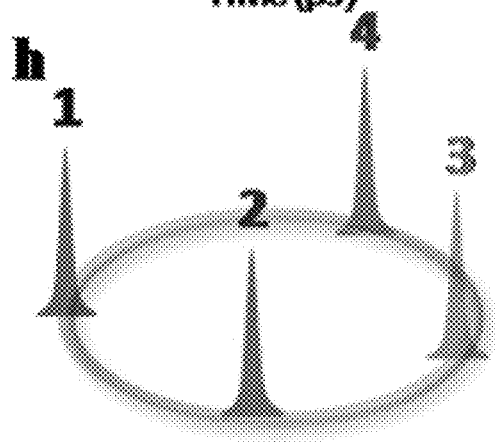

Fluctuations of the pulsewidths: To calculate the pulsewidths of the singlet solitons, we fitted 50 measured pulses with Gaussian profiles and the average FWHM pulsewidth is 1.7±0.08 ps (FIG. 11a) after demagnification and deconvolution. The average repetition period of the singlet soliton is 11.5±0.3 ps, as shown in FIG. 11b. Considering the real-time oscilloscope has a sampling rate fs of 80 GS/s, we attribute the fluctuation in the measured pulsewidth to the oscilloscope's 145-fs digitization error:

$$\varepsilon = \frac{1}{\sqrt{2} f_s M_{UTM}} \quad (EQ. 8)$$

Figure 13A:
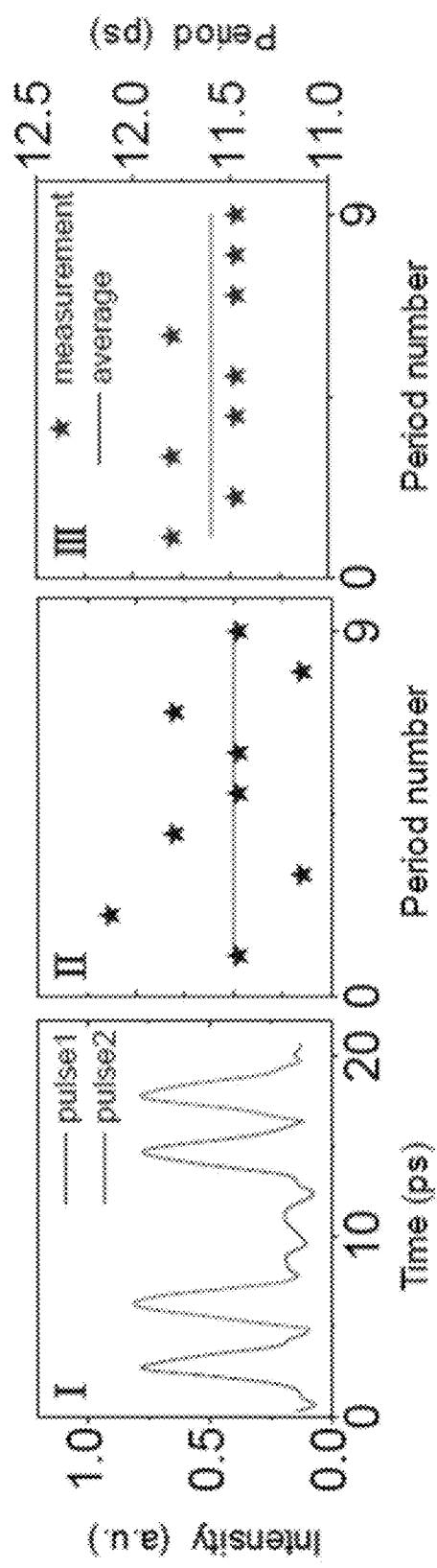
Figure 13B:
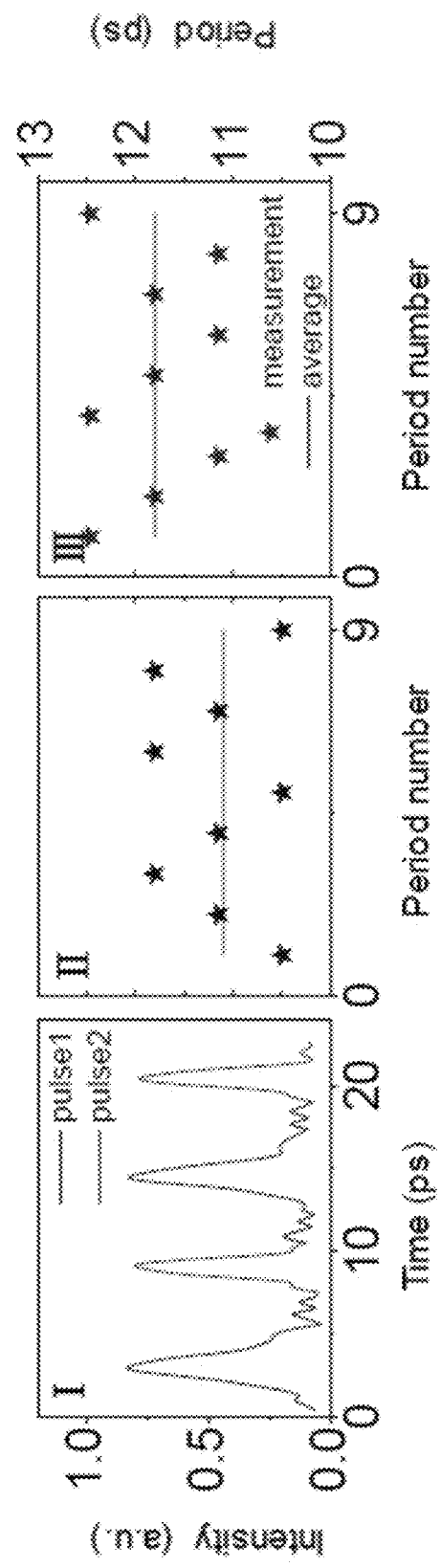
Figure 13D:
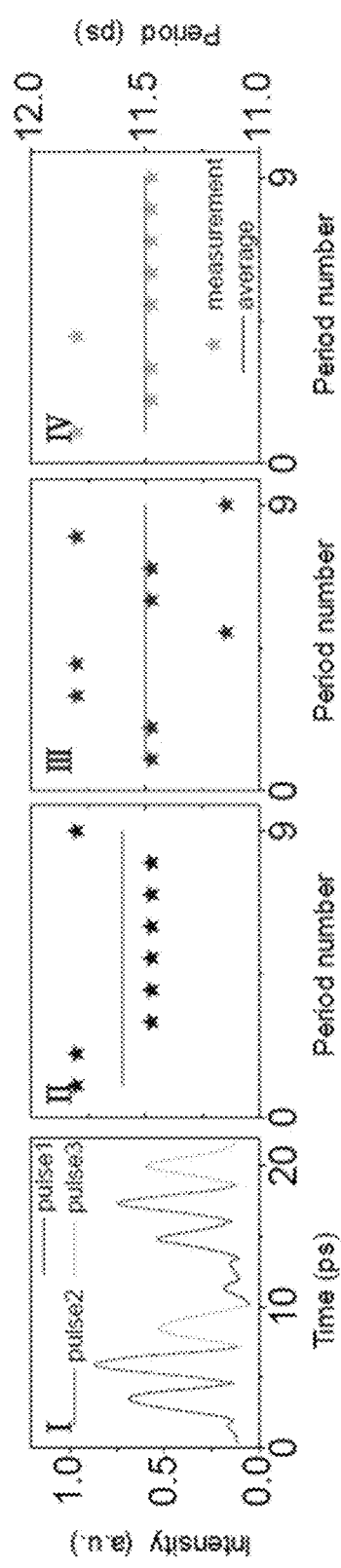
Figure 13E:
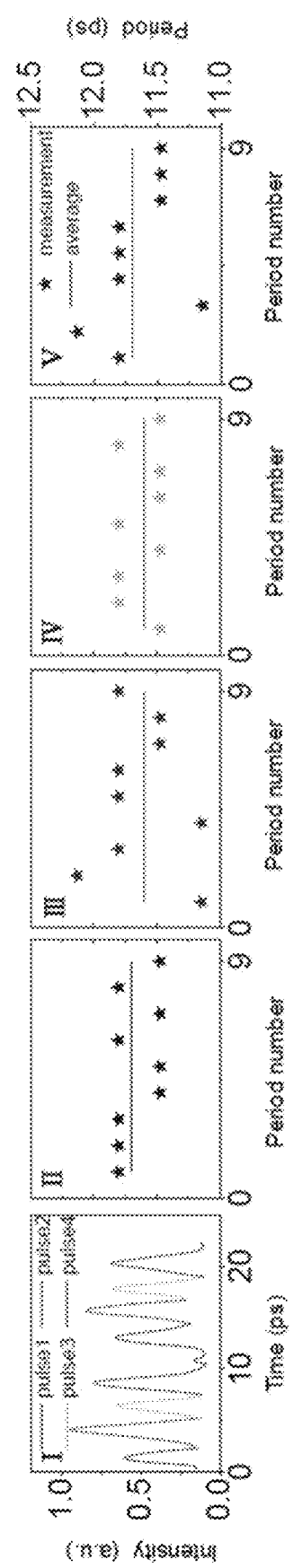

Dissipative Kerr soliton molecules were also observed as shown in FIG. 5 and FIG. 12. In FIG. 13, we summarize the repetition periods of individual constitutive pulses in the soliton molecules. For each type of Kerr soliton molecules, 10 consecutive measurements were taken and analyzed. Take the doublet state as an example (FIG. 13a). The first constitutive pulse (blue) has an average repetition period of 11.5±0.3 ps (FIG. 13aII) while the second constitutive pulse (red) has an average repetition period of 11.6±0.2 ps (13aIII). Within the measurement error limited by the oscilloscope, both constitutive pulses have the same repetition period corresponding to the inverse of the FSR of the adiabatically tapered $Si_3N_4$ microring (FIG. 1d).

DOCTRINE OF EQUIVALENTS

While the above description contains many specific embodiments of the invention, these should not be construed as limitations on the scope of the invention, but rather as an example of one embodiment thereof. Accordingly, the scope of the invention should be determined not by the embodiments illustrated, but by the appended claims and their equivalents.

What is claimed is:

1. A microresonator-based optical frequency comb, comprising:
    an optical pump configured to generate pulses of light;
    an ultrafast temporal magnifier; and
    a microresonator cavity comprising:
        an input waveguide configured to receive pulses generated by the optical pump,
        a microring waveguide having an adiabatically tapered width configured to generate a Kerr frequency comb producing single-mode, dispersion-managed dissipative Kerr solitons;
        a coupling region for coupling the pulses from the input waveguide into the microring waveguide, and
        an output waveguide configured to output pulses generated by the microring waveguide;
    wherein the ultrafast temporal magnifier is a time-domain counterpart of a high-speed digital microscope system and enables observation of evolution and transition dynamics of the dispersion-managed dissipative Kerr solitons; and
    wherein the dispersion-managed dissipative Kerr solitons sustain more pulse energy than static Kerr solitons.

2. The frequency comb of claim 1, wherein the microresonator is formed of a $Si_3N_4$ material.

3. The frequency comb of claim 1, wherein the varying width of the microring waveguide is configured to induce an oscillating group velocity dispersion to the pulses along the microresonator cavity.

4. The frequency comb of claim 3, wherein the oscillating group velocity dispersion is configured as a Gaussian-like optical spectrum.

5. The frequency comb of claim 1, wherein the input waveguide and the microring waveguide in the coupling region are configured to be single-mode.

6. The frequency comb of claim 1, wherein the dispersion is a third-order dispersion effect.

7. The frequency comb of claim 1, wherein the optical pump comprises an external cavity diode laser (ECDL).

8. The frequency comb of claim 1, wherein the microresonator is configured to operate in a stretched-pulse mode at close-to-zero net cavity group velocity dispersion.

9. The frequency comb of claim 1, wherein the coupling of the pulses of light into the microring waveguide is critical.

* * * * *